United States Patent
Shang et al.

(10) Patent No.: US 11,862,098 B2
(45) Date of Patent: Jan. 2, 2024

(54) SHIFT REGISTER, DRIVING METHOD, DRIVING CONTROL CIRCUIT, AND DISPLAY DEVICE

(71) Applicant: BOE Technology Group Co., Ltd., Beijing (CN)

(72) Inventors: Guangliang Shang, Beijing (CN); Jie Zhang, Beijing (CN); Shuo Huang, Beijing (CN); Libin Liu, Beijing (CN); Shiming Shi, Beijing (CN); Hao Liu, Beijing (CN); Haoliang Zheng, Beijing (CN); Xing Yao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 184 days.

(21) Appl. No.: 17/628,779

(22) PCT Filed: Apr. 9, 2021

(86) PCT No.: PCT/CN2021/086119
§ 371 (c)(1),
(2) Date: Jan. 20, 2022

(87) PCT Pub. No.: WO2021/223565
PCT Pub. Date: Nov. 11, 2021

(65) Prior Publication Data
US 2022/0383822 A1     Dec. 1, 2022

(30) Foreign Application Priority Data

May 8, 2020   (CN) .......................... 202010382849.5

(51) Int. Cl.
G09G 3/3266 (2016.01)
G09G 3/36 (2006.01)
G11C 19/28 (2006.01)

(52) U.S. Cl.
CPC ......... G09G 3/3266 (2013.01); G09G 3/3677 (2013.01); G11C 19/28 (2013.01);
(Continued)

(58) Field of Classification Search
CPC ............... G09G 3/3266; G09G 3/3677; G09G 2300/0852; G09G 2310/0286;
(Continued)

(56) References Cited

U.S. PATENT DOCUMENTS

2014/0240209 A1   8/2014 Zhang
2016/0307641 A1*  10/2016 Zheng ................. G09G 3/3648
(Continued)

FOREIGN PATENT DOCUMENTS

CN     202443728 U     9/2012
CN     104715734 A     6/2015
(Continued)

OTHER PUBLICATIONS

CN202010382849.5 first office action.

*Primary Examiner* — Premal R Patel
(74) *Attorney, Agent, or Firm* — IPro, PLLC

(57) ABSTRACT

A shift register, a driving method, a driving control circuit and a display device. The method comprises: at a data refresh stage (T10), applying to an input signal end (IP) an input signal having a pulse level, applying a control clock pulse signal to a control clock signal end, and applying a noise reduction clock pulse signal to a noise reduction clock signal end; at a noise reduction holding phase (T21-1), applying a fixed voltage signal to the input signal end (IP), applying a fixed voltage signal to the control clock signal end, and applying a fixed voltage signal to the noise reduction clock signal end; and at a noise reduction enhancement stage (T22-1), applying a fixed voltage signal to the input signal end (IP), applying a fixed voltage signal to the control
(Continued)

clock signal end, and applying a clock pulse signal to the noise reduction clock signal end.

16 Claims, 10 Drawing Sheets

(52) U.S. Cl.
CPC ............... *G09G 2300/0852* (2013.01); *G09G 2310/0286* (2013.01)

(58) Field of Classification Search
CPC ......... G09G 2340/0435; G09G 3/3674; G11C 19/28; G11C 7/02
See application file for complete search history.

(56) References Cited

U.S. PATENT DOCUMENTS

| | | |
|---|---|---|
| 2016/0334923 A1 | 11/2016 | Chan |
| 2017/0061869 A1 | 3/2017 | Bae et al. |
| 2017/0153742 A1* | 6/2017 | Pang .................... G06F 3/04166 |
| 2017/0287393 A1* | 10/2017 | Ma ....................... G09G 3/3266 |
| 2017/0287404 A1* | 10/2017 | Kim ........................ G09G 3/20 |
| 2018/0197455 A1 | 7/2018 | Han et al. |
| 2019/0189234 A1 | 6/2019 | Chen et al. |
| 2020/0020269 A1 | 1/2020 | Hwang et al. |
| 2020/0066211 A1 | 2/2020 | Lee et al. |
| 2020/0143734 A1 | 5/2020 | Yamasaki et al. |
| 2020/0303028 A1 | 9/2020 | Gu et al. |
| 2021/0142752 A1 | 5/2021 | Li et al. |

FOREIGN PATENT DOCUMENTS

| | | |
|---|---|---|
| CN | 105632564 A | 6/2016 |
| CN | 105741740 A | 7/2016 |
| CN | 106023919 A | 10/2016 |
| CN | 106504722 A | 3/2017 |
| CN | 107256701 A | 10/2017 |
| CN | 108831403 A | 11/2018 |
| CN | 109767717 A | 5/2019 |
| CN | 110060645 A | 7/2019 |
| CN | 110517622 A | 11/2019 |
| CN | 110880301 A | 3/2020 |
| CN | 110910813 A | 3/2020 |
| CN | 111105759 A | 5/2020 |
| CN | 111445866 A | 7/2020 |
| KR | 20180013300 A | 2/2018 |
| KR | 20200022066 A | 3/2020 |

\* cited by examiner

SHIFT REGISTER, DRIVING METHOD, DRIVING CONTROL CIRCUIT, AND DISPLAY DEVICE

CROSS-REFERENCE TO RELATED APPLICATIONS

This application is a national phase entry under 35 U.S.C. § 371 of International Application No. PCT/CN2021/086119, filed on Apr. 9, 2021, which claims priority of Chinese Patent Application No. 202010382849.5, filed with the China National Intellectual Property Administration (CNIPA) on May 8, 2020 and entitled "Shift Register, Driving Method, Driving Control Circuit and Display Device", the entire content of which is incorporated herein by reference.

FIELD

The present disclosure relates to the technical field of display, in particular to a shift register, a driving method, a driving control circuit and a display device.

BACKGROUND

With the rapid development of a display technology, a display device is increasingly developed towards the direction of high integration and low cost. According to a Gate Driver on Array (GOA) technology, a Thin Film Transistor (TFT) driving control circuit is integrated on an array substrate of the display device so as to perform scanning driving for the display device. The driving control circuit is generally composed of a plurality of cascaded shift registers. However, unstable output of the shift register may cause display abnormality.

SUMMARY

A driving method of a shift register provided by embodiments of the present disclosure includes: at a first refresh frequency, one display frame including a data refresh stage and a data retention stage, wherein the data retention stage includes a denoising retention stage and a denoising enhancement stage alternately arranged;
at the data refresh stage, loading an input signal with a pulse level to an input signal end, loading a control clock pulse signal to a control clock signal end, loading a noise reduction clock pulse signal to a noise reduction clock signal end, loading a fixed voltage signal to a first reference signal end, and loading a fixed voltage signal to a second reference signal end, so as to control a cascade signal end of the shift register to output a cascade signal with a pulse level, and control a driving signal end of the shift register to output a driving signal with a pulse level;
at the denoising retention stage, loading a fixed voltage signal to the input signal end, loading a fixed voltage signal to the control clock signal end, loading a fixed voltage signal to the noise reduction clock signal end, loading a fixed voltage signal to the first reference signal end, and loading a fixed voltage signal to the second reference signal end, so as to control the cascade signal end to output a fixed voltage signal, and control the driving signal end to output a fixed voltage signal; and
at the denoising enhancement stage, loading a fixed voltage signal to the input signal end, loading a fixed voltage signal to the control clock signal end, loading a clock pulse signal to the noise reduction clock signal end, loading a fixed voltage signal to the first reference signal end, and loading a fixed voltage signal to the second reference signal end, so as to control the cascade signal end to output a fixed voltage signal, and control the driving signal end to output a fixed voltage signal.

Optionally, in embodiments of the present disclosure, the noise reduction clock signal end includes a first noise reduction clock signal end and a second noise reduction clock signal end; and the noise reduction clock pulse signal includes a first noise reduction clock pulse signal and a second noise reduction clock pulse signal. Cycles of the first noise reduction clock pulse signal and the second noise reduction clock pulse signal are the same, and a phase difference is ½ cycle.

At the data refresh stage, the loading the noise reduction clock pulse signal to the noise reduction clock signal end includes: loading the first noise reduction clock pulse signal to the first noise reduction clock signal end, and loading the second noise reduction clock pulse signal to the second noise reduction clock signal end.

At the denoising retention stage, the loading the fixed voltage signal to the noise reduction clock signal end includes: loading a fixed voltage signal with a first level to the first noise reduction clock signal end, and loading a fixed voltage signal with the first level to the second noise reduction clock signal end.

At the denoising enhancement stage, the loading the clock pulse signal to the noise reduction clock signal end includes: loading the first noise reduction clock pulse signal to the first noise reduction clock signal end, and loading the second noise reduction clock pulse signal to the second noise reduction clock signal end. The first level of the first noise reduction clock pulse signal in the denoising enhancement stage is adjacent to the denoising retention stage appearing before the denoising enhancement stage, and a second level of the second noise reduction clock pulse signal in the denoising enhancement stage is adjacent to the denoising retention stage appearing before the denoising enhancement stage.

Optionally, in embodiments of the present disclosure, in the denoising enhancement stage, the quantity of clock cycles of the first noise reduction clock pulse signal and the quantity of clock cycles of the second noise reduction clock pulse signal are the same, and the quantity of the clock cycles is at least one.

Optionally, in embodiments of the present disclosure, in the same denoising enhancement stage, a falling edge of the first noise reduction clock pulse signal and a falling edge of the second noise reduction clock pulse signal are respectively aligned with a starting moment of a denoising retention stage appearing after the denoising enhancement stage, and a rising edge of the second noise reduction clock pulse signal is aligned with an end moment of the denoising retention stage appearing before the denoising enhancement stage.

In the data refresh stage and the denoising enhancement stage, maintaining durations of the second level of the second noise reduction clock pulse signal are the same.

Optionally, in embodiments of the present disclosure, in the denoising enhancement stage, the quantity of the clock cycles of the first noise reduction clock pulse signal is an even number.

In the same denoising enhancement stage, a falling edge of the first noise reduction clock pulse signal is aligned with a starting moment of a denoising retention stage appearing after the denoising enhancement stage, and in the first noise reduction clock pulse signal, a signal between a rising edge close to the denoising retention stage appearing before the denoising enhancement stage and the denoising retention stage appearing before the denoising enhancement stage is the first level.

In the same denoising enhancement stage, a rising edge of the second noise reduction clock pulse signal is aligned with an end moment of the denoising retention stage appearing before the denoising enhancement stage, and in the second noise reduction clock pulse signal, a signal between a falling edge close to the denoising retention stage appearing after the denoising enhancement stage and the denoising retention stage appearing after the denoising enhancement stage is the first level.

Optionally, in embodiments of the present disclosure, the control clock signal end includes a first control clock signal end and a second control clock signal end, the control clock pulse signal includes a first control clock pulse signal and a second control clock pulse signal. Cycles of the first control clock pulse signal and the second control clock pulse signal are the same, and a phase difference is ½ cycle.

The pulse levels of the input signal and the cascade signal are the first levels.

The pulse level of the driving signal is the second level.

The fixed voltage signal of the first reference signal end is the first level.

The fixed voltage signal of the second reference signal end is the second level.

The loading the control clock pulse signal to the control clock signal end includes: loading the first control clock pulse signal to the first control clock signal end, and loading the second control clock pulse signal to the second control clock signal end.

The loading the fixed voltage signal to the control clock signal end includes: loading a fixed voltage signal with the second level to the first control clock signal end, and loading a fixed voltage signal with the second level to the second control clock signal end.

The loading the fixed voltage signal to the input signal end includes: loading a fixed voltage signal with the second level to the input signal end.

The controlling the cascade signal end to output the fixed voltage signal and the controlling the driving signal end to output the fixed voltage signal include: controlling the cascade signal end to output a fixed voltage signal with the second level, and controlling the driving signal end to output a fixed voltage signal with the first level.

Optionally, in embodiments of the present disclosure, the driving method further includes: at a second refresh frequency, one display frame including a data refresh stage; and at the data refresh stage, loading an input signal with a pulse level to the input signal end, loading a control clock pulse signal to the control clock signal end, loading a noise reduction clock pulse signal to the noise reduction clock signal end, loading a fixed voltage signal to the first reference signal end, and loading a fixed voltage signal to the second reference signal end, so as to control the cascade signal end of the shift register to output a cascade signal with a pulse level, and control the driving signal end of the shift register to output a driving signal with a pulse level.

A shift register provided by embodiments of the present disclosure includes:

an input control circuit, respectively coupled with an input signal end, a first control clock signal end, a second control clock signal end, a first reference signal end, a second reference signal end, a pull-down node and a first pull-up node, wherein the input control circuit is configured to provide a signal of the input signal end to the first pull-up node in response to a signal of the first control clock signal end, provide a signal of the second reference signal end to the signal of the first pull-up node in response to a signal of the pull-down node and a signal of the second control clock signal end, and control the signal of the pull-down node according to the signal of the first pull-up node, the signal of the first control clock signal end and a signal of the first reference signal end;

a first transistor, wherein a grid electrode of the first transistor is configured to be coupled with the first reference signal end, a first electrode of the first transistor is configured to be coupled with the first pull-up node, and a second electrode of the first transistor is configured to be coupled with a second pull-up node;

a cascade output circuit, respectively coupled with the pull-down node, the second pull-up node, the second reference signal end, the second control clock signal end and a cascade signal end, wherein the cascade output circuit is configured to provide the signal of the second control clock signal end to the cascade signal end under control of a signal of the second pull-up node, and provide the signal of the second reference signal end to the cascade signal end under control of the signal of the pull-down node; and a driving output circuit, respectively coupled with the cascade signal end, a first noise reduction clock signal end, a second noise reduction clock signal end, the first reference signal end, the second reference signal end and a driving signal end, wherein the driving output circuit is configured to provide the signal of the second reference signal end to the driving signal end in response to a signal of the cascade signal end, and provide the signal of the first reference signal end to the driving signal end in response to signals of the first noise reduction clock signal end and the second noise reduction clock signal end.

Optionally, in embodiments of the present disclosure, the driving output circuit includes: a second transistor, a third transistor, a fourth transistor, a fifth transistor, a first capacitor and a second capacitor.

A grid electrode of the second transistor is coupled with the cascade signal end, a first electrode of the second transistor is coupled with the second reference signal end, and a second electrode of the second transistor is coupled with a grid electrode of the fifth transistor.

A grid electrode of the third transistor is coupled with the first noise reduction clock signal end, a first electrode of the third transistor is coupled with the first reference signal end, and a second electrode of the third transistor is coupled with the grid electrode of the fifth transistor.

A grid electrode of the fourth transistor is coupled with the cascade signal end, a first electrode of the fourth transistor is coupled with the second reference signal end, and a second electrode of the fourth transistor is coupled with the driving signal end.

A first electrode of the fifth transistor is coupled with the first reference signal end, and a second electrode of the fifth transistor is coupled with the driving signal end.

A first electrode of the first capacitor is coupled with the second noise reduction clock signal end, and a second electrode of the first capacitor is coupled with the grid electrode of the fifth transistor.

A first electrode of the second capacitor is coupled with the grid electrode of the fifth transistor, and the second electrode of the first capacitor is coupled with the driving signal end.

Optionally, in embodiments of the present disclosure, the cascade output circuit includes: a sixth transistor, a seventh transistor, a third capacitor and a fourth capacitor.

A grid electrode of the sixth transistor is coupled with the second pull-up node, a first electrode of the sixth transistor is coupled with the second control clock signal end, and a second electrode of the sixth transistor is coupled with the cascade signal end.

A grid electrode of the seventh transistor is coupled with the pull-down node, a first electrode of the seventh transistor is coupled with the second reference signal end, and a second electrode of the seventh transistor is coupled with the cascade signal end.

A first electrode of the third capacitor is coupled with the second pull-up node, and a second electrode of the third capacitor is coupled with the cascade signal end.

A first electrode of the fourth capacitor is coupled with the pull-down node, and a second electrode of the fourth capacitor is coupled with the second reference signal end.

Optionally, in embodiments of the present disclosure, the input control circuit includes: an eighth transistor, a ninth transistor, a tenth transistor, an eleventh transistor and a twelfth transistor.

A grid electrode of the eighth transistor is coupled with the first control clock signal end, a first electrode of the eighth transistor is coupled with the input signal end, and a second electrode of the eighth transistor is coupled with the first pull-up node.

A grid electrode of the ninth transistor is coupled with the first control clock signal end, a first electrode of the ninth transistor is coupled with the first reference signal end, and a second electrode of the ninth transistor is coupled with the pull-down node.

A grid electrode of the tenth transistor is coupled with the first pull-up node, a first electrode of the tenth transistor is coupled with the first control clock signal end, and a second electrode of the tenth transistor is coupled with the pull-down node.

A grid electrode of the eleventh transistor is coupled with the pull-down node, a first electrode of the eleventh transistor is coupled with the second reference signal end, and a second electrode of the eleventh transistor is coupled with a first electrode of the twelfth transistor.

A grid electrode of the twelfth transistor is coupled with the second control clock signal end, and a second electrode of the twelfth transistor is coupled with the first pull-up node.

Optionally, in embodiments of the present disclosure, a width-to-length ratio of a channel region of an active layer of at least one of the fourth transistor, the fifth transistor, the sixth transistor or the seventh transistor is greater than a width-to-length ratio of a channel region of an active layer of at least one of the first transistor, the second transistor, the third transistor, the eighth transistor, the ninth transistor, the tenth transistor, the eleventh transistor or the twelfth transistor.

Optionally, in embodiments of the present disclosure, the width-to-length ratio of the channel region of the active layer of at least one of the fourth transistor, the fifth transistor, the sixth transistor or the seventh transistor ranges from 10 μm/2 μm to 100 μm/10 μm.

The width-to-length ratio of the channel region of the active layer of at least one of the first transistor, the second transistor, the third transistor, the eighth transistor, the ninth transistor, the tenth transistor, the eleventh transistor or the twelfth transistor ranges from 2 μm/2 μm to 20 μm/10 μm.

Optionally, in embodiments of the present disclosure, a capacitance value of at least one of the first capacitor, the second capacitor, the third capacitor or the fourth capacitor ranges from 10 fF to 1 pF.

A driving control circuit provided by embodiments of the present disclosure includes the plurality of above cascaded shift registers.

An input signal end of a first-stage shift register is coupled with a frame trigger signal end.

In every two adjacent stages of shift registers, an input signal end of one shift register is coupled with a cascade signal end of the other shift register at a previous stage of the one shift register.

A display device provided by embodiments of the present disclosure includes the above driving control circuit.

DETAILED DESCRIPTION OF THE EMBODIMENTS

Figure 1:
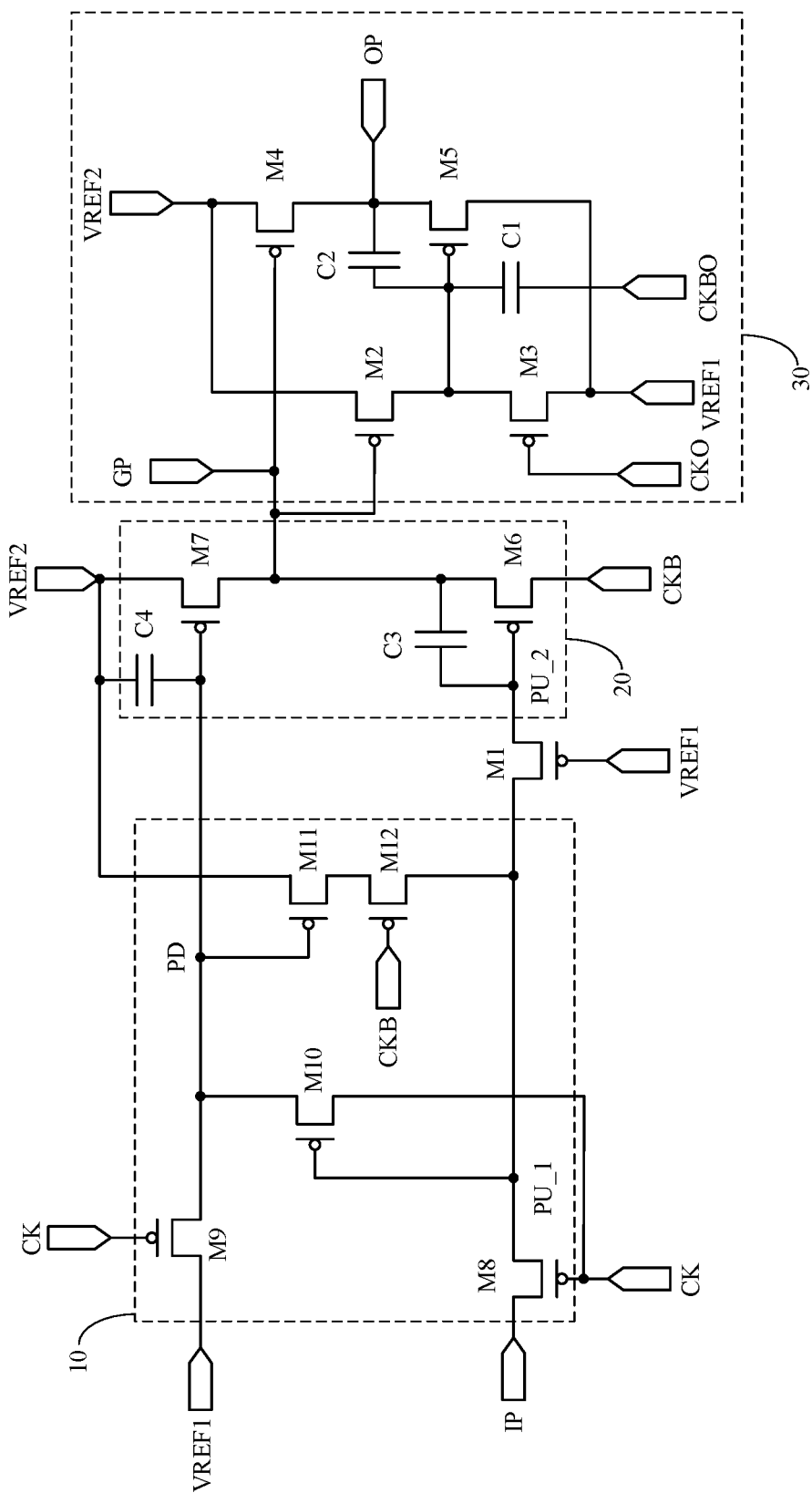
FIG. 1 is a schematic structural diagram of a shift register provided by an embodiment of the present disclosure.

In order to make the objective, technical solutions and advantages of the embodiments of the present disclosure more clear, the technical solutions of the embodiments of the present disclosure will be described clearly and completely with reference to the drawings of the embodiments of the present disclosure. Obviously, the described embodiments are part of the embodiments of the present disclosure, but not all the embodiments. The embodiments in the present disclosure and features in the embodiments may be mutually combined in the case of no conflict. On the basis of the described embodiments of the present disclosure, all other embodiments obtained by a person of ordinary skill in the art without inventive efforts fall within the protection scope of the present disclosure.

Unless otherwise defined, the technical or scientific terms used in the present disclosure shall have the usual meanings understood by a person of ordinary skill in the art to which the present disclosure belongs. The words "first", "second" and the like used in the present disclosure do not indicate any order, quantity or importance, but are only used to distinguish different components. The word "including" or "comprising" and the like, means that an element or item preceding the word includes an element or item listed after the word and the equivalent thereof, without excluding other elements or items. The word "connection" or "coupling" and the like is not restricted to physical or mechanical connection, but may include electrical connection, whether direct or indirect.

It should be noted that the sizes and shapes of all graphs in the drawings do not reflect the true scale, and only intend to illustrate the content of the present disclosure. The same or similar reference numbers represent the same or similar elements or elements with the same or similar functions from beginning to end.

Generally, in order to reduce power consumption of a display device, the display device can be driven at a relatively low refresh frequency (such as 1 Hz), and a signal output by a driving signal end is abnormal due to long-time electric leakage accumulation of a transistor.

Embodiments of the present disclosure provide some shift registers. As shown in FIG. 1, the shift register may include an input control circuit 10, a first transistor M1, a cascade output circuit 20, and a driving output circuit 30.

The input control circuit 10 is respectively coupled with an input signal end IP, a first control clock signal end CK, a second control clock signal end CKB, a first reference signal end VREF1, a second reference signal end VREF2, a pull-down node PD and a first pull-up node PU_1. The input control circuit is configured to provide a signal of the input signal end IP to the first pull-up node PU_1 in response to a signal of the first control clock signal end CK, and provide a signal of the second reference signal end VREF2 to a signal of the first pull-up node PU_1 in response to a signal of the pull-down node PD and a signal of the second control clock signal end CKB, and control the signal of the pull-down node PD according to the signal of the first pull-up node PU_1, the signal of the first control clock signal end CK and a signal of the first reference signal end VREF1.

A grid electrode of the first transistor M1 is configured to be coupled with the first reference signal end VREF1. A first electrode of the first transistor M1 is configured to be coupled with the first pull-up node PU_1. A second electrode of the first transistor M1 is configured to be coupled with a second pull-up node PU2.

The cascade output circuit 20 is respectively coupled with the pull-down node PD, the second pull-up node PU_2, the second reference signal end VREF2, the second control clock signal end CKB and a cascade signal end GP. The cascade output circuit 20 is configured to provide the signal of the second control clock signal end CKB to the cascade signal end GP under control of a signal of the second pull-up node PU_2, and provide the signal of the second reference signal end VREF2 to the cascade signal end GP under control of the signal of the pull-down node PD.

The driving output circuit 30 is respectively coupled with the cascade signal end GP, a first noise reduction clock signal end CKO, a second noise reduction clock signal end CKBO, the first reference signal end VREF1, the second reference signal end VREF2 and a driving signal end OP. The driving output circuit 30 is configured to provide the signal of the second reference signal end VREF2 to the driving signal end OP in response to a signal of the cascade signal end GP, and provide the signal of the first reference signal end VREF1 to the driving signal end OP in response to signals of the first noise reduction clock signal end CKO and the second noise reduction clock signal end CKBO.

According to the shift register provided by the embodiments of the present disclosure, the input control circuit, the first transistor and the driving output circuit are mutually matched to work by loading corresponding signals to each signal end, so that the cascade signal end and the driving signal end can respectively output corresponding signals. Moreover, the shift register may further supplement charges at a denoising enhancement stage, so that an output denoising capability is ensured, stable output of the driving signal end is maintained, and therefore, the shift register in the present application may be advantageously applied to a display device with a relatively low refresh frequency.

During implementations, as shown in FIG. 1, the first pull-up node PU_1 is coupled between a second electrode of an eighth transistor M8 in the input control circuit 10 and a first electrode of the first transistor M1. The second pull-up node PU_2 is coupled between a grid electrode of a sixth transistor M6 in the cascade output circuit 20 and a second electrode of the first transistor M1. The pull-down node PD is coupled between a second electrode of a ninth transistor M9 in the input control circuit 10 and a grid electrode of a seventh transistor M7 in the cascade output circuit 20. It should be noted that the first pull-up node PU_1, the second pull-up node PU_2 and the pull-down node PD are virtual nodes in the shift register respectively, the three nodes are only used for describing a structure of the shift register and signal transmission conveniently, and the structure of the shift register and signal transmission may be determined according to a coupling mode among each transistor and capacitor in the shift register.

During implementations, in the embodiments of the present disclosure, as shown in FIG. 1, the driving output circuit 30 may include: a second transistor M2, a third transistor M3, a fourth transistor M4, a fifth transistor M5, a first capacitor C1 and a second capacitor C2.

A grid electrode of the second transistor M2 is coupled with the cascade signal end GP. A first electrode of the second transistor M2 is coupled with the second reference signal end VREF2. A second electrode of the second transistor M2 is coupled with a grid electrode of the fifth transistor M5.

A grid electrode of the third transistor M3 is coupled with the first noise reduction clock signal end CKO. A first electrode of the third transistor M3 is coupled with the first reference signal end VREF1. A second electrode of the third transistor M3 is coupled with the grid electrode of the fifth transistor M5.

A grid electrode of the fourth transistor M4 is coupled with the cascade signal end GP. A first electrode of the fourth transistor M4 is coupled with the second reference signal end VREF2. A second electrode of the fourth transistor M4 is coupled with the driving signal end OP.

A first electrode of the fifth transistor M5 is coupled with the first reference signal end VREF1. A second electrode of the fifth transistor M5 is coupled with the driving signal end OP.

A first electrode of the first capacitor C1 is coupled with the second noise reduction clock signal end CKBO. A second electrode of the first capacitor C1 is coupled with the grid electrode of the fifth transistor M5.

A first electrode of the second capacitor C2 is coupled with the grid electrode of the fifth transistor M5. A second electrode of the second capacitor C2 is coupled with the driving signal end OP.

During implementations, in embodiments of the present disclosure, as shown in FIG. 1, the cascade output circuit 20 may include: the sixth transistor M6, the seventh transistor M7, a third capacitor C3 and a fourth capacitor C4.

The grid electrode of the sixth transistor M6 is coupled with the second pull-up node PU_2. A first electrode of the sixth transistor M6 is coupled with the second control clock signal end CKB. A second electrode of the sixth transistor M6 is coupled with the cascade signal end GP.

The grid electrode of the seventh transistor M7 is coupled with the pull-down node PD. A first electrode of the seventh transistor M7 is coupled with the second reference signal end VREF2. A second electrode of the seventh transistor M7 is coupled with the cascade signal end GP.

A first electrode of the third capacitor C3 is coupled with the second pull-up node PU_2. A second electrode of the third capacitor C3 is coupled with the cascade signal end GP.

A first electrode of the fourth capacitor C4 is coupled with the pull-down node PD. A second electrode of the fourth capacitor C4 is coupled with the second reference signal end VREF2.

During implementations, in embodiments of the present disclosure, as shown in FIG. 1, the input control circuit 10 may include: the eighth transistor M8, the ninth transistor M9, a tenth transistor M10, an eleventh transistor M11 and a twelfth transistor M12.

A grid electrode of the eighth transistor M8 is coupled with the first control clock signal end CK. A first electrode of the eighth transistor M8 is coupled with the input signal end IP. The second electrode of the eighth transistor M8 is coupled with the first pull-up node PU_1.

A grid electrode of the ninth transistor M9 is coupled with the first control clock signal end CK. A first electrode of the ninth transistor M9 is coupled with the first reference signal end VREF1. The second electrode of the ninth transistor M9 is coupled with the pull-down node PD.

A grid electrode of the tenth transistor M10 is coupled with the first pull-up node PU_1. A first electrode of the tenth transistor M10 is coupled with the first control clock signal end CK. A second electrode of the tenth transistor M10 is coupled with the pull-down node PD.

A grid electrode of the eleventh transistor M11 is coupled with the pull-down node PD. A first electrode of the eleventh transistor M11 is coupled with the second reference signal end VREF2. A second electrode of the eleventh transistor M11 is coupled with a first electrode of the twelfth transistor M12.

A grid electrode of the twelfth transistor M12 is coupled with the second control clock signal end CKB. A second electrode of the twelfth transistor M12 is coupled with the first pull-up node PU_1.

During implementations, the first electrodes of the above transistors may serve as their source electrodes, and the second electrodes of the transistors may serve as their drain electrodes according to a flowing direction of signals; or, the first electrodes serve as their drain electrodes, and the second electrodes serve as their source electrodes, which is not specifically distinguished here.

It should be noted that the transistors mentioned in the above embodiments of the present disclosure may be TFTs, or metal oxide semiconductor (MOS) field effect transistors, which is not limited here.

Figure 3:
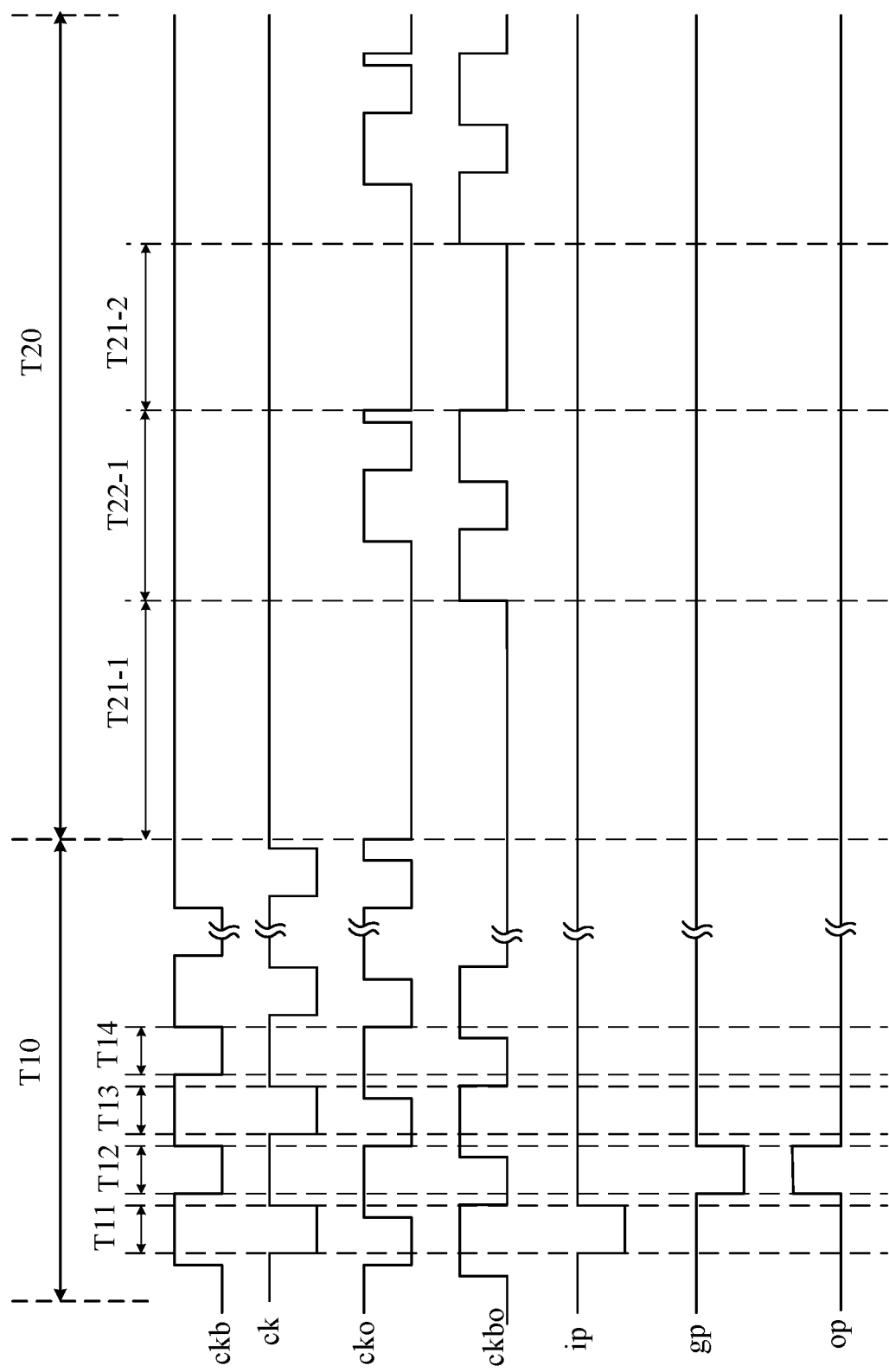
FIG. 3 is some signal sequence diagrams provided by an embodiment of the present disclosure.

In order to simplify a preparation process, during implementations, in embodiments of the present disclosure, as shown in FIG. 1 and FIG. 3, all the transistors may be P-type transistors. The P-type transistor is conducted when a voltage difference $V_{gs}$ between the grid electrode and source electrode of the P-type transistor and a threshold voltage $V_{th}$ of the P-type transistor meet a relation $V_{gs}<V_{th}$. For example, when the third transistor M3 is a P-type transistor, the third transistor M3 is conducted when a relation between a voltage difference $V_{gs3}$ between the grid electrode and the source electrode of the third transistor M3 and a threshold voltage $V_{th3}$ of the third transistor M3 meets a formula $V_{gs3}<V_{th3}$. In the embodiments of the present disclosure, it is illustrated only by taking an example that the transistors are the P-type transistors. As for a case that the transistors are N-type transistors, the design principle is the same as that of the present disclosure and also belongs to the protection range of the present disclosure. Moreover, the N-type transistor is conducted when a voltage difference $V_{gs}$ between grid electrode and source electrode of the N-type transistor and a threshold voltage $V_{th}$ of the N-type transistor meet a relation $V_{gs}>V_{th}$. For example, when the third transistor M3 is an N-type transistor, the third transistor M3 is conducted when a relation between a voltage difference Vgs3 between the grid electrode and the source electrode of the third transistor M3 and a threshold voltage $V_{th3}$ of the third transistor M3 meets a formula: $V_{gs3}>V_{th3}$.

Further, during implementations, the P-type transistors are cut off under the action of a high-level signal and are conducted under the action of a low-level signal. The N-type transistors are conducted under the action of a high-level signal and are cut off under the action of a low-level signal.

During implementations, a width-to-length ratio of a channel region of an active layer of at least one of the fourth transistor M4, the fifth transistor M5, the sixth transistor M6 or the seventh transistor M7 may be made to be greater than a width-to-length ratio of a channel region of an active layer of at least one of the first transistor M1, the second transistor M2, the third transistor M3, the eighth transistor M8, the ninth transistor M9, the tenth transistor M10, the eleventh transistor M11 or the twelfth transistor M12. Exemplarily, the width-to-length ratio of the channel region of the active layer of the fourth transistor M4, the width-to-length ratio of the channel region of the active layer of the fifth transistor M5, the width-to-length ratio of the channel region of the active layer of the sixth transistor M6 and the width-to-length ratio of the channel region of the active layer of the seventh transistor M7 may be made to be greater than the width-to-length ratio of the channel region of the active layer of the first transistor M1, the width-to-length ratio of the channel region of the active layer of the second transistor M2, the width-to-length ratio of the channel region of the active layer of the third transistor M3, the width-to-length ratio of the channel region of the active layer of the eighth transistor M8, the width-to-length ratio of the channel region of the active layer of the ninth transistor M9, the width-to-length ratio of the channel region of the active layer of the tenth transistor M10, the width-to-length ratio of the channel region of the active layer of the eleventh transistor M11, and the width-to-length ratio of the channel region of the active layer of the twelfth transistor M12.

During implementations, the width-to-length ratio of the channel region of the active layer of at least one of the fourth transistor M4, the fifth transistor M5, the sixth transistor M6 or the seventh transistor M7 may be made to range from 10 μm/2 μm to 100 μm/10 μm. Exemplarily, the width-to-length ratio of the channel region of the active layer of the fourth transistor M4, the width-to-length ratio of the channel region of the active layer of the fifth transistor M5, the width-to-length ratio of the channel region of the active layer of the sixth transistor M6, and the width-to-length ratio of the channel region of the active layer of the seventh transistor M7 may be made to range from 10 μm/2 μm to 100 μm/10 μm. For example, the width-to-length ratio of the channel region of the active layer of the fourth transistor M4, the width-to-length ratio of the channel region of the active layer of the fifth transistor M5, the width-to-length ratio of the channel region of the active layer of the sixth transistor M6, and the width-to-length ratio of the channel region of the active layer of the seventh transistor M7 may be made to be ranged at 10 μm/2 μm respectively. The width-to-length ratio of the channel region of the active layer of the fourth transistor M4, the width-to-length ratio of the channel region of the active layer of the fifth transistor M5, the width-to-length ratio of the channel region of the active layer of the sixth transistor M6, and the width-to-length ratio of the channel region of the active layer of the seventh transistor M7 may also be made to be ranged at 100 μm/10 μm respectively. The width-to-length ratio of the channel region of the active layer of the fourth transistor M4, the width-to-length ratio of the channel region of the active layer of the fifth transistor M5, the width-to-length ratio of the channel region of the active layer of the sixth transistor M6, and the width-to-length ratio of the channel region of the active layer of the seventh transistor M7 may also be made to be ranged at 50 μm/5 μm respectively.

In practical application, numerical values of the width-to-length ratio of the channel region of the active layer of the fourth transistor M4, the width-to-length ratio of the channel region of the active layer of the fifth transistor M5, the width-to-length ratio of the channel region of the active layer of the sixth transistor M6 and the width-to-length ratio of the channel region of the active layer of the seventh transistor M7 may be designed according to demands of practical application, which is not limited here.

During implementations, the width-to-length ratio of the channel region of the active layer of at least one of the first transistor M1, the second transistor M2, the third transistor M3, the eighth transistor M8, the ninth transistor M9, the tenth transistor M10, the eleventh transistor M11 or the twelfth transistor M12 may be made to range from 2 μm/2 μm to 20 μm/10 μm. Exemplarily, the width-to-length ratio of the channel region of the active layer of the first transistor M1, the width-to-length ratio of the channel region of the active layer of the second transistor M2, the width-to-length ratio of the channel region of the active layer of the third transistor M3, the width-to-length ratio of the channel region of the active layer of the eighth transistor M8, the width-to-length ratio of the channel region of the active layer of the ninth transistor M9, the width-to-length ratio of the channel region of the active layer of the tenth transistor M10, the width-to-length ratio of the channel region of the active layer of the eleventh transistor M11, and the width-to-length ratio of the channel region of the active layer of the twelfth transistor M12 may be made to range from 2 μm/2 μm to 20 μm/10 μm. For example, the width-to-length ratio of the channel region of the active layer of the first transistor M1, the width-to-length ratio of the channel region of the active layer of the second transistor M2, the width-to-length ratio of the channel region of the active layer of the third transistor M3, the width-to-length ratio of the channel region of the active layer of the eighth transistor M8, the width-to-length ratio of the channel region of the active layer of the ninth transistor M9, the width-to-length ratio of the channel region of the active layer of the tenth transistor M10, the width-to-length ratio of the channel region of the active layer of the eleventh transistor M11, and the width-to-length ratio of the channel region of the active layer of the twelfth transistor M12 may be made to be ranged at 2 μm/2 μm. The width-to-length ratio of the channel region of the active layer of the first transistor M1, the width-to-length ratio of the channel region of the active layer of the second transistor M2, the width-to-length ratio of the channel region of the active layer of the third transistor M3, the width-to-length ratio of the channel region of the active layer of the eighth transistor M8, the width-to-length ratio of the channel region of the active layer of the ninth transistor M9, the width-to-length ratio of the channel region of the active layer of the tenth transistor M10, the width-to-length ratio of the channel region of the active layer of the eleventh transistor M11, and the width-to-length ratio of the channel region of the active layer of the twelfth transistor M12 may also be made to be ranged at 20 μm/10 μm. The width-to-length ratio of the channel region of the active layer of the first transistor M1, the width-to-length ratio of the channel region of the active layer of the second transistor M2, the width-to-length ratio of the channel region of the active layer of the third transistor M3, the width-to-length ratio of the channel region of the active layer of the eighth transistor M8, the width-to-length ratio of the channel region of the active layer of the ninth transistor M9, the width-to-length ratio of the channel region of the active layer of the tenth transistor M10, the width-to-length ratio of the channel region of the active layer of the eleventh transistor M11, and the width-to-length ratio of the channel region of the active layer of the twelfth transistor M12 may also be made to be ranged at 10 μm/5 μm.

In practical application, numerical values of the width-to-length ratio of the channel region of the active layer of the first transistor M1, the width-to-length ratio of the channel region of the active layer of the second transistor M2, the width-to-length ratio of the channel region of the active layer of the third transistor M3, the width-to-length ratio of the channel region of the active layer of the eighth transistor M8, the width-to-length ratio of the channel region of the active layer of the ninth transistor M9, the width-to-length ratio of the channel region of the active layer of the tenth transistor M10, the width-to-length ratio of the channel region of the active layer of the eleventh transistor M11, and the width-to-length ratio of the channel region of the active layer of the twelfth transistor M12 may be designed according to the demands of the practical application, which is not limited here.

During implementations, a capacitance value of at least one of the first capacitor C1, the second capacitor C2, the third capacitor C3 or the fourth capacitor C4 may be made to range from 10 fF to 1 pF. Exemplary, the capacitance value of at least one of the first capacitor C1, the second capacitor C2, the third capacitor C3 or the fourth capacitor C4 may be made to be ranged at 10 fF. The capacitance value of at least one of the first capacitor C1, the second capacitor C2, the third capacitor C3 or the fourth capacitor C4 may also be made to be ranged at 50 fF. The capacitance value of at least one of the first capacitor C1, the second capacitor C2, the third capacitor C3 or the fourth capacitor C4 may also be made to be ranged at 1 pF. In the practical application, the capacitance value of the first capacitor C1, the capacitance value of the second capacitor C2, the capacitance value of the third capacitor C3 and the capacitance value of the fourth capacitor C4 may be designed according to the demands of the practical application, which is not limited here.

The specific structure of the shift register provided by the embodiments of the present disclosure is only illustrated above. During implementations, the structure of each of the above circuit is not limited to the above structure provided by the embodiments of the present disclosure, and may further be other structures known by those skilled in the art, which is not limited here.

Figure 2:
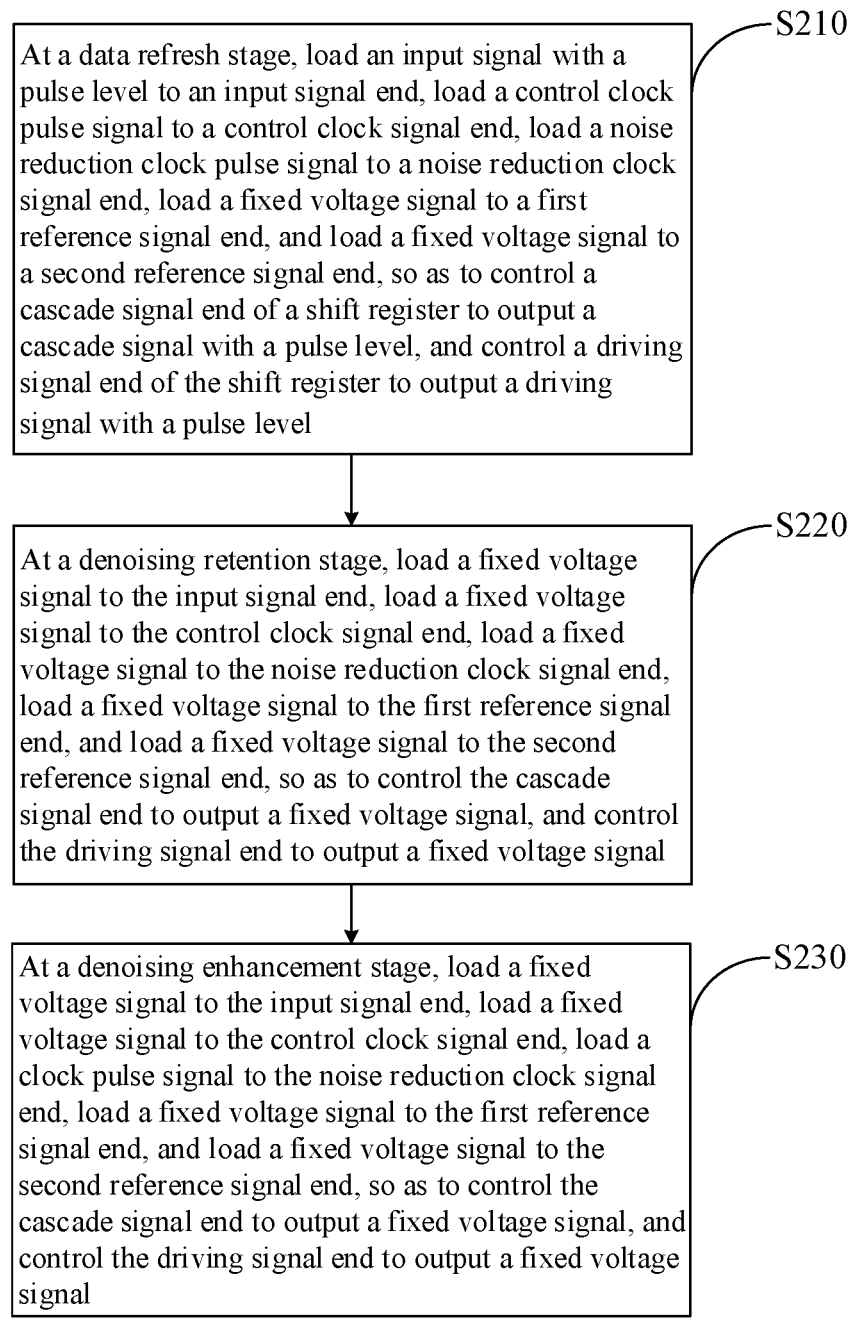
FIG. 2 is a flow chart of a driving method provided by an embodiment of the present disclosure.

Based on the same inventive concept, embodiments of the present disclosure further provide a driving method of a shift register. As shown in combination with FIG. 2, the driving method may include the following operations S210, S220, and S230. At a first refresh frequency, one display frame includes a data refresh stage T10 and a data retention stage T20. The data retention stage T20 includes a denoising retention stage and a denoising enhancement stage alternately arranged.

S210, at the data refresh stage T10, an input signal with a pulse level is loaded to an input signal end IP, a control clock pulse signal is loaded to a control clock signal end, a noise reduction clock pulse signal is loaded to a noise reduction clock signal end, a fixed voltage signal is loaded to a first reference signal end VREF1, and a fixed voltage signal is loaded to a second reference signal end VREF2, so that a cascade signal end GP of the shift register is controlled to output a cascade signal with a pulse level, and a driving signal end OP of the shift register is controlled to output a driving signal with a pulse level.

S220, at the denoising retention stage, a fixed voltage signal is loaded to the input signal end IP, a fixed voltage signal is loaded to the control clock signal end, a fixed voltage signal is loaded to the noise reduction clock signal end, a fixed voltage signal is loaded to the first reference signal end VREF1, and a fixed voltage signal is loaded to the second reference signal end VREF2, so that the cascade signal end GP is controlled to output a fixed voltage signal, and the driving signal end OP is controlled to output a fixed voltage signal.

S230, at the denoising enhancement stage, a fixed voltage signal is loaded to the input signal end IP, a fixed voltage signal is loaded to the control clock signal end, a clock pulse signal is loaded to the noise reduction clock signal end, a fixed voltage signal is loaded to the first reference signal end VREF1, and a fixed voltage signal is loaded to the second reference signal end VREF2, so that the cascade signal end GP is controlled to output a fixed voltage signal, and the driving signal end OP is controlled to output a fixed voltage signal.

According to the driving method of the shift register provided by the embodiments of the present disclosure, at the data refresh stage T10, the input signal with the pulse level is loaded to the input signal end IP, the control clock pulse signal is loaded to the control clock signal end, the noise reduction clock pulse signal is loaded to the noise reduction clock signal end, the fixed voltage signal is loaded to the first reference signal end VREF1, and the fixed voltage signal is loaded to the second reference signal end VREF2, so that the cascade signal end GP can be controlled to output the cascade signal with the pulse level, and the driving signal end OP can be controlled to output the driving signal with the pulse level. In this way, cascade output and driving output of the shift register can be realized, and therefore, a display device may perform data refreshing. At the denoising retention stage, the fixed voltage signal is loaded to the input signal end IP, the fixed voltage signal is loaded to the control clock signal end, the fixed voltage signal is loaded to the noise reduction clock signal end, the fixed voltage signal is loaded to the first reference signal end VREF1, and the fixed voltage signal is loaded to the second reference signal end VREF2, so that the cascade signal end GP can be controlled to output the fixed voltage signal, and the driving signal end OP can be controlled to output the fixed voltage signal. In this way, output retention of the shift register can be realized. At the denoising enhancement stage, the fixed voltage signal is loaded to the input signal end IP, the fixed voltage signal is loaded to the control clock signal end, the clock pulse signal is loaded to the noise reduction clock signal end, the fixed voltage signal is loaded to the first reference signal end VREF1, and the fixed voltage signal is loaded to the second reference signal end VREF2, so that the cascade signal end GP can be controlled to output the fixed voltage signal, and the driving signal end OP can be controlled to output the fixed voltage signal. In this way, the shift register can supplement charges, the output denoising capability is ensured, and output of the driving signal end OP is kept stable.

Moreover, the display device generally may be in a static picture display state or a standby state for a long time, and in order to reduce power consumption, the display device may work at a low refresh frequency (such as 1 Hz and 30 Hz). According to the shift register in the embodiments of the present disclosure, the shift register can supplement the charges at the denoising enhancement stage, so that the output denoising capability is ensured, the output of the driving signal end OP is kept stable, and the shift register in the present application can be advantageously applied to a display device with the low refresh frequency.

During implementations, in embodiments of the present disclosure, the first level may be a low level, and the second level may be a high level. Alternatively, the first level may also be a high level, and the second level may also be a low level. In practical application, it may be designed and determined according to practical application demands, which is not limited here.

During implementations, in embodiments of the present disclosure, the driving method further includes: at a second refresh frequency, one display frame includes a data refresh stage T10; at the data refresh stage T10, an input signal with a pulse level is loaded to the input signal end IP, a control clock pulse signal is loaded to the control clock signal end, a noise reduction clock pulse signal is loaded to the noise reduction clock signal end, a fixed voltage signal is loaded to the first reference signal end VREF1, and a fixed voltage signal is loaded to the second reference signal end VREF2, so that the cascade signal end GP of the shift register is controlled to output a cascade signal with a pulse level, and the driving signal end OP of the shift register is controlled to output a driving signal with a pulse level.

The display device generally may be in a static picture display state or a standby state for a long time, and in order to reduce the power consumption, the display device may work at a relatively low refresh frequency (such as 1 Hz and 30 Hz). The display device may also display a video picture, and in order to improve a display effect of the video picture, the display device may work at a relatively high refresh frequency (such as 60 Hz and 120 Hz). During implementations, in embodiments of the present disclosure, the first refresh frequency may be the relatively low refresh frequency, for example 1 Hz and 30 Hz. The second refresh frequency may be the relatively high refresh frequency, for example 60 Hz and 120 Hz.

During implementations, in embodiments of the present disclosure, the control clock signal end includes a first control clock signal end CK and a second control clock signal end CKB; and the control clock pulse signal includes a first control clock pulse signal and a second control clock pulse signal. Cycles of the first control clock pulse signal and the second control clock pulse signal are the same, and a phase difference between the first control clock pulse signal and the second control clock pulse signal is ½ cycle. Moreover, at the data refresh stage T10, the loading the control clock pulse signal to the control clock signal end includes: the first control clock pulse signal is loaded to the first control clock signal end CK, and the second control clock pulse signal is loaded to the second control clock signal end CKB.

Exemplarily, as shown in FIG. 1 and FIG. 3, ck represents a signal loaded to the first control clock signal end CK, and ckb represents a signal loaded to the second control clock signal end CKB. At the data refresh stage T10, the first control clock pulse signal loaded to the first control clock signal end CK is a high-low level switching clock pulse signal, and the second control clock pulse signal loaded to the second control clock signal end CKB is also a high-low level switching clock pulse signal. Moreover, the cycles of the first control clock pulse signal and the second control clock pulse signal are the same, and the phase difference is the ½ cycle. For example, duty cycles of the first control clock pulse signal and the second control clock pulse signal are the same, and the duty cycle is greater than 50%. In the practical application, the implementations of the first control clock pulse signal and the second control clock pulse signal can be designed and determined according to the practical application demands, which is not limited here.

During implementations, in embodiments of the present disclosure, in the denoising retention stage and the denoising enhancement stage, the loading the fixed voltage signal to the control clock signal end may include: a fixed voltage signal with a second level is loaded to the first control clock signal end CK, and a fixed voltage signal with the second level is loaded to the second control clock signal end CKB. Exemplarily, as shown in FIG. 1 and FIG. 3, when transistors in the shift register are P-type transistors, a fixed voltage signal with a high level may be loaded to the first control clock signal end CK, and a fixed voltage signal with a high level may be loaded to the second control clock signal end CKB. When the transistors in the shift register are N-type transistors, a fixed voltage signal with a low level may be loaded to the first control clock signal end CK, and a fixed voltage signal with a low level may be loaded to the second control clock signal end CKB.

During implementations, in embodiments of the present disclosure, in the denoising retention stage and the denoising enhancement stage, the loading the fixed voltage signal to the input signal end IP may include: a fixed voltage signal with the second level is loaded to the input signal end IP. Exemplarily, as shown in FIG. 1 and FIG. 3, ip represents a signal loaded to the input signal end IP. When the transistors in the shift register are the P-type transistors, a fixed voltage signal with a high level may be loaded to the input signal end IP. When the transistors in the shift register are the N-type transistors, a fixed voltage signal with a low level may be loaded to the input signal end IP.

During implementations, in embodiments of the present disclosure, in the denoising retention stage and the denoising enhancement stage, the controlling the cascade signal end GP to output the fixed voltage signal and the controlling the driving signal end OP to output the fixed voltage signal may include: the cascade signal end GP is controlled to output a fixed voltage signal with the second level, and the driving signal end OP is controlled to output a fixed voltage signal with the first level. Exemplarily, as shown in FIG. 1 and FIG. 3, gp represents a signal output by the cascade signal end GP, and op represents a signal output by the driving signal end OP. When the transistors in the shift register are the P-type transistors, the cascade signal end GP may be controlled to output a fixed voltage signal with a high level, and the driving signal end OP may be controlled to output a fixed voltage signal with a low level. When the transistors in the shift register are the N-type transistors, the cascade signal end GP may be controlled to output a fixed voltage signal with a low level, and the driving signal end OP may be controlled to output a fixed voltage signal with a high level.

During implementations, in embodiments of the present disclosure, the pulse level of the input signal may be made to be the first level. In this way, when an eighth transistor M8 is conducted, the pulse level of the input signal may be input to a first pull-up node PU_1, so that a level of the first pull-up node PU_1 is the first level, and thus a tenth transistor M10 may be controlled to be conducted through the level of the first pull-up node PU_1. Exemplarily, as shown in FIG. 1 and FIG. 3, when the transistors in the shift register are the P-type transistors, the pulse level of the input signal is a low level. When the transistors in the shift register are the N-type transistors, the pulse level of the input signal is a high level.

During implementations, in embodiments of the present disclosure, the pulse level of the cascade signal may be made to be the first level. In this way, a fourth transistor M4 may be conducted under the control of the pulse level of the cascade signal so as to provide the signal of the second reference signal end VREF2 to the driving signal end OP. Exemplarily, as shown in FIG. 1 and FIG. 3, when the transistors in the shift register are the P-type transistors, the pulse level of the cascade signal is a low level. When the transistors in the shift register are the N-type transistors, the pulse level of the cascade signal is a high level.

During implementations, in embodiments of the present disclosure, the fixed voltage signal of the first reference signal end VREF1 may be made to be the first level, the fixed voltage signal of the second reference signal end VREF2 may be made to be the second level, and the pulse level of the driving signal may be made to be the second level. Exemplarily, as shown in FIG. 1 and FIG. 3, when the transistors in the shift register are the P-type transistors, the first level is a low level, and the second level is a high level. When the transistors in the shift register are the N-type transistors, the first level is a high level, and the second level is a low level.

During implementations, in embodiments of the present disclosure, the noise reduction clock signal end may include a first noise reduction clock signal end CKO and a second noise reduction clock signal end CKBO. The noise reduction clock pulse signal includes a first noise reduction clock pulse signal and a second noise reduction clock pulse signal. Cycles of the first noise reduction clock pulse signal and the second noise reduction clock pulse signal are the same, and a phase difference between the first noise reduction clock pulse signal and the second noise reduction clock pulse is ½ cycle. Moreover, at the data refresh stage T10, the loading the noise reduction clock pulse signal to the noise reduction clock signal end may include: the first noise reduction clock pulse signal is loaded to the first noise reduction clock signal end CKO, and the second noise reduction clock pulse signal is loaded to the second noise reduction clock signal end CKBO.

Exemplarily, as shown in FIG. 1 and FIG. 3, cko represents a signal loaded to the first noise reduction clock signal end CKO, and ckbo represents a signal loaded to the second noise reduction clock signal end CKBO. At the data refresh stage T10, the first noise reduction clock pulse signal loaded to the first noise reduction clock signal end CKO is a high-low level switching clock pulse signal, and the second noise reduction clock pulse signal loaded to the second noise reduction clock signal end CKBO is also a high-low level switching clock pulse signal. Moreover, the cycles of the first noise reduction clock pulse signal and the second noise reduction clock pulse signal are the same, and the phase difference is the ½ cycle. For example, duty cycles of the first noise reduction clock pulse signal and the second noise reduction clock pulse signal are the same, and the duty cycle is greater than 50%. In the practical application, the implementations of the first noise reduction clock pulse signal and the second noise reduction clock pulse signal can be designed and determined according to the practical application demands, which is not limited here.

In some examples, as shown in FIG. 3, the cycle of the first noise reduction clock pulse signal and the cycle of the first control clock pulse signal may be made to be the same. Further, the duty cycle of the first noise reduction clock pulse signal and the duty cycle of the first control clock pulse signal may be made to be the same. Exemplarily, a falling edge of the first noise reduction clock pulse signal is aligned with a rising edge of the second control clock pulse signal. A falling edge of the second noise reduction clock pulse signal is aligned with a rising edge of the first control clock pulse signal. In the practical application, a relationship among the first noise reduction clock pulse signal, the second noise reduction clock pulse signal, the first control clock pulse signal and the second control clock pulse signal can be designed and determined according to practical demands, which is not limited here.

During implementations, in embodiments of the present disclosure, at the denoising retention stage, the loading the fixed voltage signal to the noise reduction clock signal end may include: a fixed voltage signal with the first level is loaded to the first noise reduction clock signal end CKO, and a fixed voltage signal with the first level is loaded to the second noise reduction clock signal end CKBO. Exemplarily, as shown in FIG. 1 and FIG. 3, when the transistors in the shift register are the P-type transistors, at the denoising retention stage, a fixed voltage signal with a low level is loaded to the first noise reduction clock signal end CKO, and a fixed voltage signal with a low level is loaded to the second noise reduction clock signal end CKBO. When the transistors in the shift register are the N-type transistors, at the denoising retention stage, a fixed voltage signal with a high level is loaded to the first noise reduction clock signal end CKO, and a fixed voltage signal with a high level is loaded to the second noise reduction clock signal end CKBO.

During implementations, in embodiments of the present disclosure, at the denoising enhancement stage, the loading the clock pulse signal to the noise reduction clock signal end include: the first noise reduction clock pulse signal is loaded to the first noise reduction clock signal end CKO, and the second noise reduction clock pulse signal is loaded to the second noise reduction clock signal end CKBO. The first level of the first noise reduction clock pulse signal in the denoising enhancement stage is adjacent to the denoising retention stage appearing before the denoising enhancement stage, and a second level of the second noise reduction clock pulse signal in the denoising enhancement stage is adjacent to the denoising retention stage appearing before the denoising enhancement stage.

Exemplarily, as shown in FIG. 1 and FIG. 3, at the denoising enhancement stage, the first noise reduction clock pulse signal loaded to the first noise reduction clock signal end CKO is a high-low level switching clock pulse signal, and the second noise reduction clock pulse signal loaded to the second noise reduction clock signal end CKBO is also a high-low level switching clock pulse signal. Moreover, when the transistors in the shift register are the P-type transistors, a low level of the first noise reduction clock pulse signal in the denoising enhancement stage is adjacent to the denoising retention stage appearing before the noise reduction enhancement stage, and a high level of the second noise reduction clock pulse signal in the denoising enhancement stage is adjacent to the denoising retention stage appearing before the denoising enhancement stage. When the transistors in the shift register are the N-type transistors, a high level of the first noise reduction clock pulse signal in the denoising enhancement stage is adjacent to the denoising retention stage appearing before the denoising enhancement stage, and a low level of the second noise reduction clock pulse signal in the denoising enhancement stage is adjacent to the denoising retention stage appearing before the denoising enhancement stage.

During implementations, in embodiments of the present disclosure, in the denoising enhancement stage, the quantity of clock cycles of the first noise reduction clock pulse signal and the quantity of clock cycles of the second noise reduction clock pulse signal are the same, and the quantity of the clock cycles is at least one. Exemplarily, as shown in FIG. 3, in the denoising enhancement stage, the quantity of the clock cycles of the first noise reduction clock pulse signal and the quantity of the clock cycles of the second noise reduction clock pulse signal are both one. The quantity of the clock cycles of the first noise reduction clock pulse signal and the quantity of the clock cycles of the second noise reduction clock pulse signal may also be made to be both two, three, four or more, which is not limited here.

During implementations, in embodiments of the disclosure, as shown in FIG. 3, in the same denoising enhancement stage, the falling edge of the first noise reduction clock pulse signal and the falling edge of the second noise reduction clock pulse signal are respectively aligned with a starting moment of a denoising retention stage appearing after the denoising enhancement stage, and a rising edge of the second noise reduction clock pulse signal is aligned with an end moment of the denoising retention stage appearing before the denoising enhancement stage. In the data refresh stage T10 and the denoising enhancement stage, maintaining durations of the second level of the second noise reduction clock pulse signal are the same. For example, in the data refresh stage T10 and the denoising enhancement stage, maintaining durations of the high level of the second noise reduction clock pulse signal are the same, and maintaining durations of the low level of the second noise reduction clock pulse signal are also the same.

A working process of the above shift register provided by embodiments of the present disclosure at the first refresh frequency is described below by taking the shift register shown in FIG. 1 as an example in combination with a signal sequence diagram as shown in FIG. 3. In the following description, 1 represents a high-level signal, 0 represents a low-level signal, and it should be noted that 1 and 0 are logic levels and are only used for better explaining the working process of the embodiments of the present disclosure instead of voltages applied to a grid electrode of each transistor during implementations.

For example, as shown in FIG. 3, at the first refresh frequency, one display frame may include the data refresh stage T10 and the data retention stage T20. The data retention stage T20 includes the denoising retention stage T21-1 and the denoising enhancement stage T22-1 alternately arranged. It should be noted that the signal sequence diagram shown in FIG. 3 is only the working process of one shift register in one current display frame. The working processes of the shift register in other display frames are basically the same as the working process in the current display frame respectively, which is not repeated here.

The data refresh stage T10 includes a T11 stage, a T12 stage, a T13 stage and a T14 stage. For example, in the T11 stage, ip=0, ckb=1, ck=0, cko=0, and ckbo=1. Because ckb=1, a twelfth transistor M12 is cut off. Because ck=0, a ninth transistor M9 is conducted to provide a low-level signal of the first reference signal end VREF1 to a pull-down node PD, and a signal of the pull-down node PD is made to be a low-level signal, so that a seventh transistor M7 is controlled to be conducted. The conducted seventh transistor M7 provides a high-level signal of the second reference signal end VREF2 to the cascade signal end GP, so that the cascade signal end GP outputs a high-level signal. Because ck=0, the eighth transistor M8 is conducted to provide a low-level signal of the input signal end IP to the first pull-up node PU_1, the first pull-up node PU_1 is made to be a low-level signal, thus the tenth transistor M10 is controlled to be conducted to provide a low-level signal of the first control clock signal end CK to the pull-down node PD, and the signal of the pull-down node PD is further made to be a low-level signal. As a first transistor M1 meets a formula: $V_{gs1} < V_{th1}$, the first transistor M1 is conducted. A second pull-up node PU_2 and the first pull-up node PU_1 are conducted through the conducted first transistor M1, so that a signal of the second pull-up node PU_2 may be made to be a low-level signal in time to control a sixth transistor M6 to be conducted to provide a high-level signal of the second control clock signal end CKB to the cascade signal end GP, and the cascade signal end GP outputs a high-level cascade signal. As the cascade signal end GP outputs the high-level signal, a second transistor M2 and the fourth transistor M4 may be controlled to be cut off. Because cko=0, a third transistor M3 is conducted to provide a low-level signal of the first reference signal end VREF1 to a grid electrode of a fifth transistor M5, so that the fifth transistor M5 is controlled to be conducted to provide the low-level signal of the first reference signal end VREF1 to the driving signal end OP, and the driving signal end OP outputs a low-level driving signal.

In the T12 stage, ip=1, ckb=0, ck=1, cko=1, and ckbo=0. Because ck=1, the ninth transistor M9 and the eighth transistor M8 are both cut off. The second pull-up node PU_2 is kept as the low-level signal under the action of a third capacitor C3 so as to control the sixth transistor M6 to be conducted to provide a low-level signal of the second control clock signal end CKB to the cascade signal end GP, and the cascade signal end GP outputs a low-level cascade signal. Due to the action of the third capacitor C3, a level of the second pull-up node PU_2 is further pulled down, so that the sixth transistor M6 is controlled to be fully conducted as far as possible to provide the low-level signal of the second control clock signal end CKB to the cascade signal end GP, and the cascade signal end GP outputs the low-level cascade signal. Moreover, in this stage, one electrode, coupled with the first pull-up node PU_1, of the first transistor M1 serves as a source electrode of the first transistor M1, so that the first transistor M1 cannot meet the formula: $V_{gs1} < V_{th1}$, the first transistor M1 is cut off, the level of the second pull-up node PU_2 can be kept stable, and a situation that the level of the second pull-up node PU_2 is increased due to electric leakage, and consequently, output of the cascade signal end GP is unstable is avoided.

Moreover, the tenth transistor M10 provides a high-level signal of the first control clock signal end CK to the pull-down node PD under the control of a signal of the first pull-up node PU_1 so as to control the seventh transistor M7 to be cut off, and adverse effects on a signal output by the cascade signal end GP are avoided. Because cko=1, the third transistor M3 is cut off. As the cascade signal end GP outputs the low-level signal, the second transistor M2 and the fourth transistor M4 may be controlled to be conducted. The conducted second transistor M2 may provide the high-level signal of the second reference signal end VREF2 to the grid electrode of the fifth transistor M5 so as to control the fifth transistor M5 to be cut off. The conducted fourth transistor M4 may provide the high-level signal of the second reference signal end VREF2 to the driving signal end OP, so that the driving signal end OP outputs a high-level driving signal.

After the T12 stage and before the T13 stage, because ckb=1, the twelfth transistor M12 is cut off. Because ck=1, the ninth transistor M9 and the eighth transistor M8 are both cut off. The second pull-up node PU_2 is kept as the low-level signal under the action of the third capacitor C3 so as to control the sixth transistor M6 to be conducted to provide the high-level signal of the second control clock signal end CKB to the cascade signal end GP, and the cascade signal end GP outputs the high-level cascade signal so as to control the second transistor M2 and the fourth transistor M4 to be both cut off. As the signal cko of the first noise reduction clock signal end CKO is converted from a high level to a low level, the third transistor M3 is conducted to be able to provide the low-level signal of the first reference signal end VREF1 to the grid electrode of the fifth transistor M5, so that the fifth transistor M5 is controlled to be conducted to provide the low-level signal of the first reference signal end VREF1 to the driving signal end OP, and the driving signal end OP outputs the low-level driving signal.

In the T13 stage, ip=1, ckb=1, ck=0, cko=0, and ckbo=1.

Because ckb=1, the twelfth transistor M12 is cut off. Because ck=0, the eighth transistor M8 and the ninth transistor M9 are both conducted. The conducted eighth transistor M8 provides the high-level signal of the input signal end IP to the first pull-up node PU_1, so that the first pull-up node PU_1 is a high-level signal, and the tenth transistor M10 is controlled to be cut off. Because the first reference signal end VREF1 is the low-level signal, the first transistor M1 is conducted to provide the high-level signal of the first pull-up node PU_1 to the second pull-up node PU_2, so that the sixth transistor M6 is controlled to be cut off. The conducted ninth transistor M9 provides the low-level signal of the first reference signal end VREF1 to the pull-down node PD, so that the signal of the pull-down node PD is a low-level signal to control the seventh transistor M7 to be conducted. The conducted seventh transistor M7 provides the high-level signal of the second reference signal end VREF2 to the cascade signal end GP, so that the cascade signal end GP outputs the high-level signal to control the second transistor M2 and the fourth transistor M4 to be both cut off. Because cko=0, the third transistor M3 is conducted to be able to provide the low-level signal of the first reference signal end VREF1 to the grid electrode of the fifth transistor M5, then the fifth transistor M5 is controlled to be conducted to provide the low-level signal of the first reference signal end VREF1 to the driving signal end OP, and the driving signal end OP outputs the low-level driving signal. Moreover, a voltage difference between two ends is kept stable through the first capacitor C1 and the second capacitor C2.

In the T14 stage, ip=1, ckb=0, ck=1, cko=1, and ckbo=0.

Because ck=1, the eighth transistor M8 and the ninth transistor M9 are both cut off, and due to the action of a fourth capacitor C4, the signal of the pull-down node PD may be kept as the low-level signal. The seventh transistor M7 is controlled to be conducted to provide the high-level signal of the second reference signal end VREF2 to the cascade signal end GP, thus the cascade signal end GP outputs the high-level signal, and the second transistor M2 and the fourth transistor M4 are controlled to be both cut off. Because cko=0, the third transistor M3 is conducted to be able to provide the low-level signal of the first reference signal end VREF1 to the grid electrode of the fifth transistor M5, then the fifth transistor M5 is controlled to be conducted to provide the low-level signal of the first reference signal end VREF1 to the driving signal end OP, and the driving signal end OP outputs the low-level driving signal. Moreover, an eleventh transistor M11 and the twelfth transistor M12 are both conducted, so that the first pull-up node PU_1 may be made to be the high-level signal, and the second pull-up node PU_2 may be made to be high-level signal, thereby controlling the sixth transistor M6 to be cut off.

After the T14 stage, the working processes of the T13 stage and the T14 stage are repeatedly executed all the time until entering into the denoising retention stage T21-1.

At the denoising retention stage T21-1, ip=1, ckb=1, ck=1, cko=0, and ckbo=0. Because ck=1, the eighth transistor M8 and the ninth transistor M9 are both cut off, and due to the action of the fourth capacitor C4, the signal of the pull-down node PD may be kept as the low-level signal. The seventh transistor M7 is controlled to be conducted to provide the high-level signal of the second reference signal end VREF2 to the cascade signal end GP, the cascade signal end GP outputs the high-level signal, and the second transistor M2 and the fourth transistor M4 are controlled to be both cut off. Because cko=0, the third transistor M3 is conducted to be able to provide the low-level signal of the first reference signal end VREF1 to the grid electrode of the fifth transistor M5, then the fifth transistor M5 is controlled to be conducted to provide the low-level signal of the first reference signal end VREF1 to the driving signal end OP, and the driving signal end OP outputs the low-level driving signal.

However, in the practical application, because cko=0 in the denoising retention stage T21-1, a threshold value of the third transistor M3 is made to drift. A gate-source voltage difference of the third transistor M3 cannot be smaller than a threshold voltage of the third transistor M3 due to the fact that the first reference signal end VREF1 is also the low level and a first electrode of the third transistor M3 is a source electrode. In this way, the third transistor M3 is made to be cut off, so that a grid voltage of the fifth transistor M5 is possibly increased, an opening degree of the fifth transistor M5 is reduced, and pull-up noise occurs to the low level output by the driving signal end OP. Based on this, in the denoising enhancement stage T22-1, the first noise reduction clock pulse signal is loaded to the first noise reduction clock signal end CKO, and the second noise reduction clock pulse signal is loaded to the second noise reduction clock signal end CKBO, so that the third transistor M3 may be normally started, the grid electrode of the fifth transistor M5 is discharged, the opening degree of the fifth transistor M5 is improved, and the output stability of the driving signal end OP is improved.

For example, in the denoising enhancement stage T22-1, firstly, ip=1, ckb=1, ck=1, cko=0, and ckbo=1. Because ck=1, the eighth transistor M8 and the ninth transistor M9 are both cut off, and due to the action of the fourth capacitor C4, the signal of the pull-down node PD may be kept as the low-level signal. The seventh transistor M7 is controlled to be conducted to be able to provide the high-level signal of the second reference signal end VREF2 to the cascade signal end GP, thus the cascade signal end GP outputs the high-level signal, and the second transistor M2 and the fourth transistor M4 are controlled to be both cut off. Because ckbo is switched from the low level to the high level, the grid voltage of the fifth transistor M5 is pulled up due to a coupling effect of the first capacitor C1. At the moment, a second electrode of the third transistor M3 is a source electrode. Because cko=0, the gate-source voltage difference of the third transistor M3 is smaller than the threshold voltage of the third transistor M3, and in this way, the third transistor M3 may be made to start. Because the third transistor M3 is conducted to be able to provide the low-level signal of the first reference signal end VREF1 to the grid electrode of the fifth transistor M5, the grid electrode of the fifth transistor M5 may be discharged, a first electrode of the first capacitor C1 is made to be a high level, and a second electrode of the first capacitor C1 is made to be a low level. Moreover, the fifth transistor M5 is also controlled to be conducted to provide the low-level signal of the first reference signal end VREF1 to the driving signal end OP, so that the driving signal end OP outputs the low-level driving signal.

Then, ip=1, ckb=1, ck=1, cko=1, and ckbo=0. Because ck=1, the eighth transistor M8 and the ninth transistor M9 are both cut off, and due to the action of the fourth capacitor C4, the signal of the pull-down node PD may be kept as the low-level signal. The seventh transistor M7 is controlled to be conducted to provide the high-level signal of the second reference signal end VREF2 to the cascade signal end GP, so that the cascade signal end GP outputs the high-level signal, and the second transistor M2 and the fourth transistor M4 are controlled to be both cut off. Because cko=1, the third transistor M3 is cut off. Because the ckbo is switched from the high level to the low level, due to the coupling effect of the first capacitor C1, the grid voltage of the fifth transistor M5 is further pulled down, so that the fifth transistor M5 may be controlled to be completely conducted as far as possible to provide the low-level signal of the first reference signal end VREF1 to the driving signal end OP as far as possible without voltage loss, and the driving signal end OP outputs the low-level driving signal.

Then, ip=1, ckb=1, ck=1, cko=0, and ckbo=1. The above working process when ip=1, ckb=1, ck=1, cko=0 and ckbo=1 is repeated again, so that the grid electrode of the fifth transistor M5 is discharged, the first electrode of the first capacitor C1 is made to be the high level, and the second electrode of the first capacitor C1 is made to be the low level.

And after the denoising enhancement stage T22-1, the working processes of the denoising retention stage T21-1 and the denoising enhancement stage T22-1 are repeatedly executed all the time until the level of the signal of the input signal end IP becomes the high level again.

It should be noted that in the data refresh stage T10, there are buffer stages (for example, stages when the signal ckb, the signal ck, the signal cko and the signal ckbo are all the high levels) between the T11 stage and the T12 stage, between the T12 stage and the T13 stage, as well as between the T13 stage and the T14 stage respectively. In the buffer stages, the characteristics of the transistors in the shift register may be stabilized, so that the shift register enters into the next working stage after being stabilized. Moreover, due to the existence of the buffer stages, rising edges and falling edges of the signal ckb and the signal ck do not completely correspond to each other, and rising edges and falling edges of the signal ckbo and the signal cko do not completely correspond to each other as well. In this way, the falling edge of the signal ckb may be prevented from being aligned with the rising edge of the signal ck, the rising edge of the signal ckb may be prevented from being aligned with the falling edge of the signal ck, the falling edge of the signal cko may be prevented from being aligned with the rising edge of the signal ckbo, and the rising edge of the signal cko may be prevented from being aligned with the falling edge of the signal ckbo, so that the stability of the shift register can be improved.

It should be noted that in the data retention stage T20 and in the denoising enhancement stage T22-1, the signal cko and the signal ckbo also have buffer stages (namely, stages when the signal cko and the signal ckbo are both high levels), and in the buffer stages, the characteristics of the transistors in the shift register can be stabilized so that the shift register can enter into the next working stage after being stabilized. Moreover, due to the existence of the buffer stages, the rising edges and the falling edges of the signal ckbo and the signal cko do not completely correspond to each other as well. In this way, the falling edge of the signal cko may be prevented from being aligned with the rising edge of the signal ckbo, and the rising edge of the signal cko may be prevented from being aligned with the falling edge of the signal ckbo, so that the stability of the shift register can be improved. And the signal cko and the signal ckbo have the buffer stages, so that the signal cko has a wave crest with a small duration at the end of the denoising enhancement stage T22-1.

It should be noted that in the practical application, a voltage value of each above signal can be designed and determined according to a practical application environment, which is not limited here.

Figure 4:
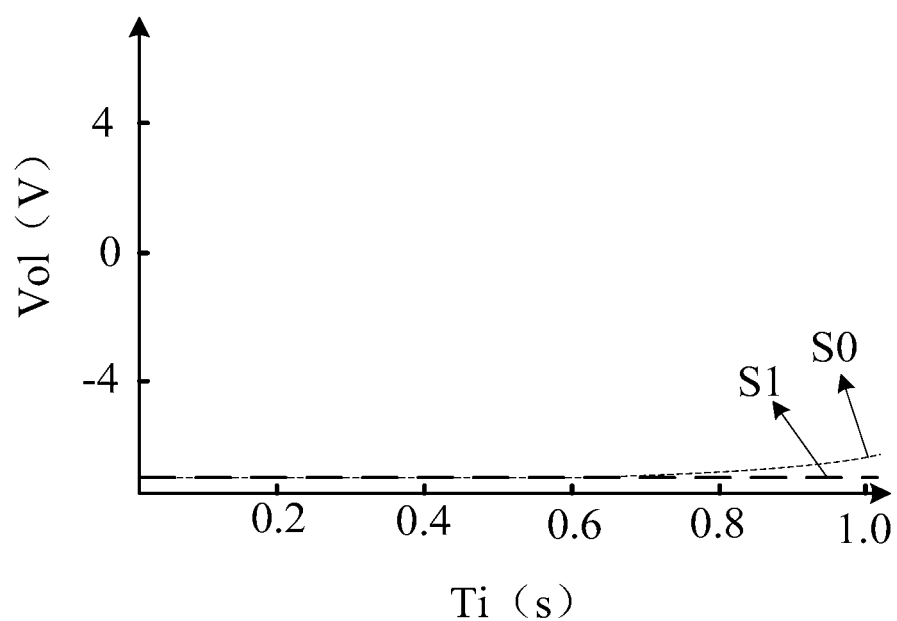
FIG. 4 is some analogue simulation diagrams provided by an embodiment of the present disclosure.

Moreover, analogue simulation is performed on the signal output by the driving signal end OP of the shift register shown in FIG. 1 according to the signal sequence diagram shown in FIG. 3, and an analogue simulation diagram is as shown in FIG. 4. The abscissa represents time, and the ordinate represents voltage. S1 represents a signal for performing analogue simulation on the driving signal end OP of the shift register shown in FIG. 1 by adopting the signal sequence diagram shown in FIG. 3. S0 represents a signal for performing analogue simulation on the driving signal end OP of the shift register when there is only the denoising retention stage in the data retention stage T20. According to the embodiments of the present disclosure, in combination with the FIG. 3, the denoising enhancement stage is set, so that the driving signal end OP can stably output the signal, and the problem of instability caused by electric leakage can be improved.

Moreover, the shift register shown in FIG. 1 is further driven to work according to the signal sequence diagram shown in FIG. 3, and it is detected that power consumption of the shift register is 0.5 mW when the shift register works at the data retention stage T20. Therefore it can be known that even if a clock pulse is inserted in the data retention stage T20, the power consumption of the shift register may also be within an acceptable range.

Figure 5:
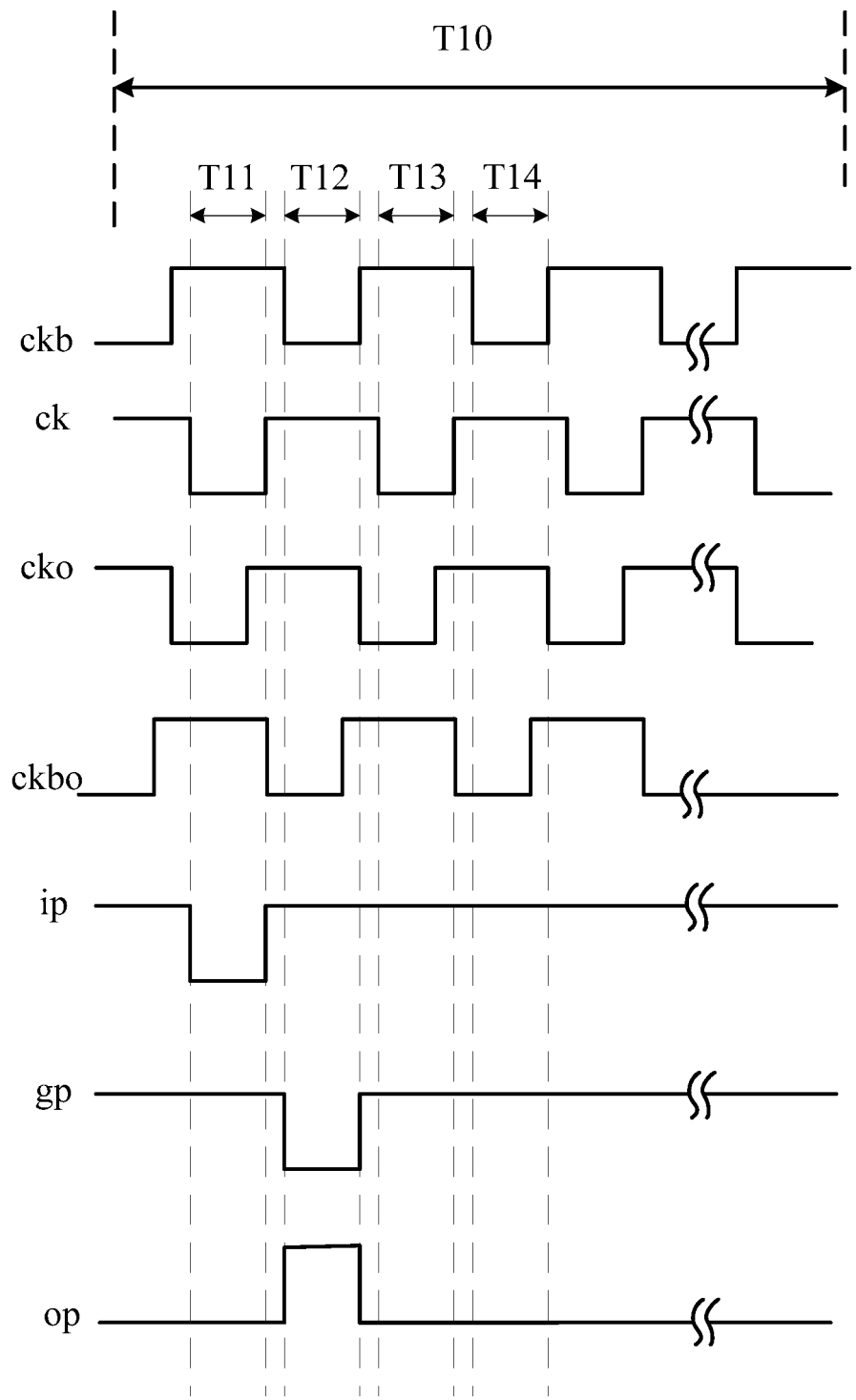
FIG. 5 is some other signal sequence diagrams provided by an embodiment of the present disclosure.

A working process of the above shift register provided by embodiments of the present disclosure at the second refresh frequency is described by taking the shift register shown in FIG. 1 as an example in combination with a signal sequence diagram as shown in FIG. 5. In the following description, 1 represents a high-level signal, 0 represents a low-level signal, and it needs to be explained that 1 and 0 are logic levels and are only used for better explaining the working process of the embodiments of the present disclosure instead of the voltages applied to a grid electrode of each transistor during implementations.

For example, as shown in FIG. 5, at the second refresh frequency, one display frame may include a data refresh stage T10. It should be noted that the signal sequence diagram shown in FIG. 5 is only the working process of one shift register in one current display frame. The working processes of the shift register in other display frames are basically the same as the working process in the current display frame respectively, which is not repeated here.

The data refresh stage T10 includes a T11 stage, a T12 stage, a T13 stage and a T14 stage. Moreover, the working process of the above shift register provided by the embodiments of the present disclosure in the signal sequence diagram shown in FIG. 5 is basically the same as the working process of the shift register in the data refresh stage T10 in the signal sequence diagram shown in FIG. 3, which is not repeated here.

Embodiments of the present disclosure also provide some other driving methods which are deformed aiming at the implementation in the above embodiments. Only the difference between the embodiments and the above embodiments is illustrated below, and the same point is not repeated here.

Figure 6:
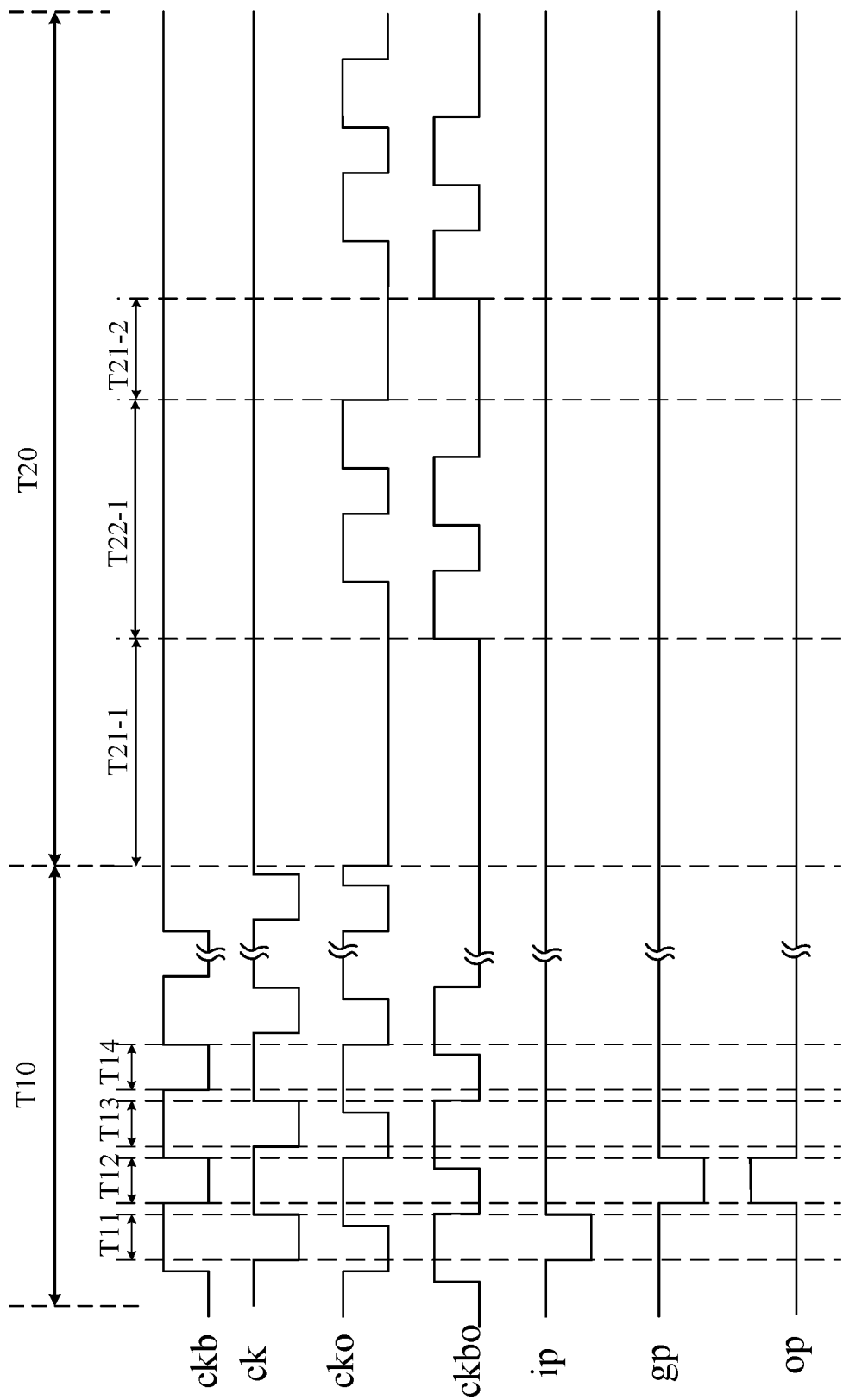
FIG. 6 is some other signal sequence diagrams provided by an embodiment of the present disclosure.

During implementations, in embodiments of the present disclosure, in the denoising enhancement stage, the quantity of the clock cycles of the first noise reduction clock pulse signal is an even number. Exemplarily, as shown in FIG. 6, the quantity of the clock cycles of the first noise reduction clock pulse signal may be made to be two. The quantity of the clock cycles of the first noise reduction clock pulse signal may also be four, six or more, which is not limited here.

During implementations, in embodiments of the present disclosure, in the same denoising enhancement stage, a falling edge of the first nose reduction clock pulse signal is aligned with a starting moment of a denoising retention stage appearing after the denoising enhancement stage, and in the first noise reduction clock pulse signal, a signal between a rising edge close to the denoising retention stage appearing before the denoising enhancement stage and the denoising retention stage appearing before the denoising enhancement stage is the first level. Exemplarily, as shown in FIG. 6, in the same denoising enhancement stage T22-1, the falling edge of the first noise reduction clock pulse signal of the signal cko may be made to be aligned with the starting time of the denoising retention stage T21-2 appearing after the denoising enhancement stage T22-1, and in the first noise reduction clock pulse signal of the signal cko, the signal between the rising edge close to the denoising retention stage T21-1 appearing before the denoising enhancement stage T22-1 and the denoising retention stage T21-1 appearing before the denoising enhancement stage T22-1 is a low level.

During implementations, in embodiments of the present disclosure, in the same denoising enhancement stage, a rising edge of the second noise reduction clock pulse signal is aligned with an end moment of the denoising retention stage appearing before the denoising enhancement stage, and in the second noise reduction clock pulse signal, a signal between a falling edge close to the denoising retention stage appearing after the denoising enhancement stage and the denoising retention stage appearing after the denoising enhancement stage is the first level. Exemplarily, as shown in FIG. 6, in the same denoising enhancement stage, the rising edge of the second noise reduction clock pulse signal of the signal ckbo may be made to be aligned with the end moment of the denoising retention stage T21-1 appearing before the denoising enhancement stage T22-1; and in the second noise reduction clock pulse signal of the signal ckbo, the signal between the falling edge close to the denoising retention stage T21-2 appearing after the denoising enhancement stage T22-1 and the denoising retention stage T21-2 appearing after the denoising enhancement stage T22-1 is a low level.

The working process of the above shift register provided by the embodiments of the present disclosure at the first refresh frequency is described below by taking the shift register shown in FIG. 1 as an example in combination with a signal sequence diagram shown in FIG. 6. In the following description, 1 represents a high-level signal, 0 represents a low-level signal, and it should be noted that 1 and 0 are logic levels and are only used for better explaining the specific working process of the embodiments of the present disclosure instead of the voltages applied to a grid electrode of each transistor during specific implementation.

For example, as shown in FIG. 6, at the first refresh frequency, one display frame may include the data refresh stage T10 and the data retention stage T20. The data retention stage T20 includes a denoising retention stage and a denoising enhancement stage alternately arranged. It should be noted that the signal sequence diagram shown in FIG. 6 is only the working process of one shift register in one current display frame. The working processes of the shift register in other display frames are basically the same as the working process in the current display frame respectively, which is not repeated here.

The working processes at the data refresh stage T10 and the denoising retention stage T21-1 may refer to the above working process, which is not repeated here.

At the denoising enhancement stage T22-1, firstly ip=1, ckb=1, ck=1, cko=0, and ckbo=1. Because ck=1, the eighth transistor M8 and the ninth transistor M9 are both cut off, and due to the action of the fourth capacitor C4, the signal of the pull-down node PD may be kept as a low-level signal. The seventh transistor M7 is controlled to be conducted to provide a high-level signal of the second reference signal end VREF2 to the cascade signal end GP, so that the cascade signal end GP outputs a high-level signal, and the second transistor M2 and the fourth transistor M4 are controlled to be both cut off. Because the ckbo is switched from the low level to the high level, the grid voltage of the fifth transistor M5 is pulled up due to the coupling effect of the first capacitor C1. At the moment, the second electrode of the third transistor M3 is a source electrode. Because cko=0, the gate-source voltage difference of the third transistor M3 is smaller than the threshold voltage of the third transistor M3, and in this way, the third transistor M3 may be to start. Because the third transistor M3 is conducted to be able to provide a low-level signal of the first reference signal end VREF1 to the grid electrode of the fifth transistor M5, the grid electrode of the fifth transistor M5 may be discharged, the first electrode of the first capacitor C1 is made to be a high level, and the second electrode of the first capacitor C1 is made to be a low level. Moreover, the fifth transistor M5 is also controlled to be conducted to provide the low-level signal of the first reference signal end VREF1 to the driving signal end OP, so that the driving signal end OP outputs a low-level driving signal.

Then, ip=1, ckb=1, ck=1, cko=1, and ckbo=0. Because ck=1, the eighth transistor M8 and the ninth transistor M9 are both cut off, and due to the action of the fourth capacitor C4, the signal of the pull-down node PD may be kept as a low-level signal. The seventh transistor M7 is controlled to be conducted to provide a high-level signal of the second reference signal end VREF2 to the cascade signal end GP, so that the cascade signal end GP outputs a high-level signal, and the second transistor M2 and the fourth transistor M4 are controlled to be both cut off. As cko=1, the third transistor M3 is cut off. Because the ckbo is switched from the high level to the low level, due to the coupling effect of the first capacitor C1, the grid voltage of the fifth transistor M5 is further pulled down, so that the fifth transistor M5 may be controlled to be completely conducted as far as possible to provide the low-level signal of the first reference signal end VREF1 to the driving signal end OP as far as possible without voltage loss, and the driving signal end OP outputs a low-level driving signal.

Then, the above working processes when ip=1, ckb=1, ck=1, cko=0 and ckbo=1 and when ip=1, ckb=1, ck=1, cko=1 and ckbo=0 are repeated again, which is not repeated here.

Figure 7:
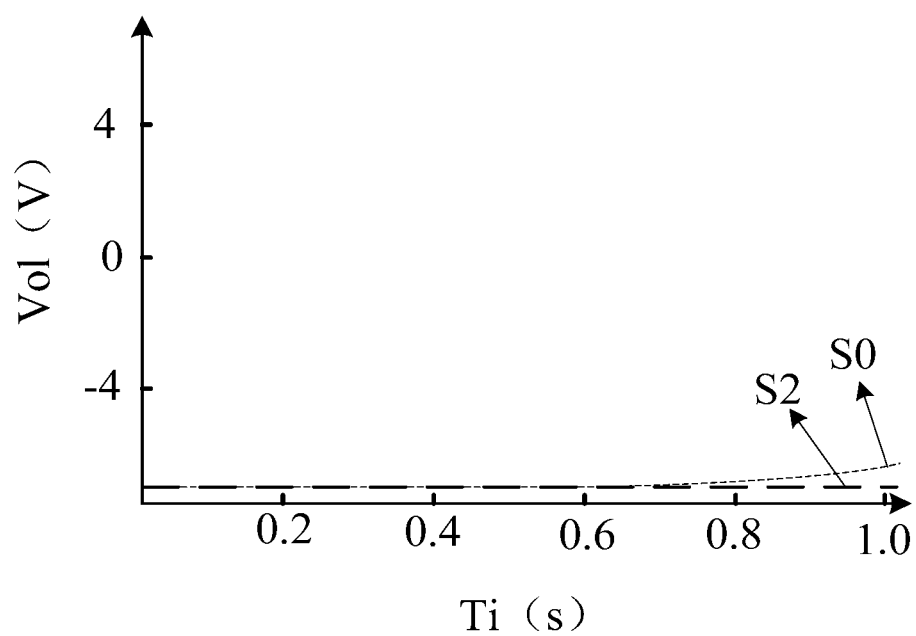
FIG. 7 is some other analogue simulation diagrams provided by an embodiment of the present disclosure.

Moreover, analogue simulation is further performed on a signal output by the driving signal end OP of the shift register shown in FIG. 1 according to the signal sequence diagram shown in FIG. 6, and an analogue simulation diagram is as shown in FIG. 7. The abscissa represents time, and the ordinate represents voltage. S2 represents a signal for performing analogue simulation on the driving signal end OP of the shift register shown in FIG. 1 by adopting the signal sequence diagram shown in FIG. 6. S0 represents a signal for performing analogue simulation at the driving signal end OP of the shift register when there is only the denoising retention stage in the data retention stage T20. It can be known in combination with FIG. 6, according to the embodiments of the present disclosure, the denoising enhancement stage is set, so that the driving signal end OP can stably output the signal, and the problem of instability caused by electric leakage can be relieved.

Moreover, the shift register shown in the FIG. 1 is further driven to work according to the signal sequence diagram shown in FIG. 6, and it is detected that power consumption of the shift register is 0.5 mW when the shift register works at the data retention stage T20. Therefore it can be known that even if a clock pulse is inserted in the data retention stage T20, the power consumption of the shift register may also be within an acceptable range.

It should be noted that maintaining durations of different denoising retention stages can be the same or different, which can be designed and determined according to the practical application demands and is not limited here.

Figure 8:
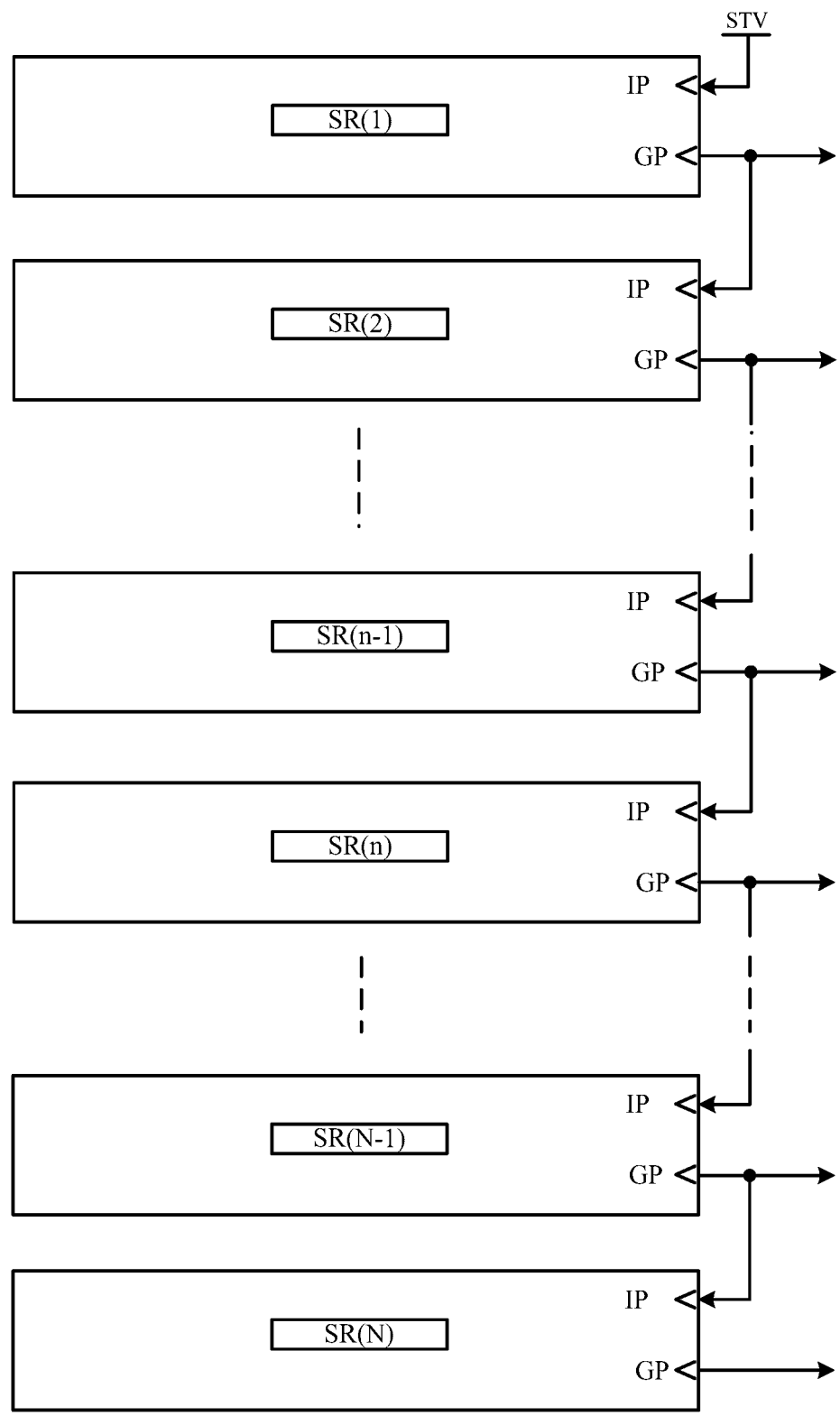
FIG. 8 is a schematic structural diagram of some driving control circuits provided by an embodiment of the present disclosure.

Based on the same inventive concept, embodiments of the present disclosure further provide a driving control circuit, as shown in FIG. 8, including the plurality of any above cascaded shift registers SR(1), SR(2) . . . SR(n−1), SR(n) . . . SR(N−1) and SR(N) (N shift registers in total, 1≤n≤N, and n is an integer) provided by the embodiments of the present disclosure. An input signal end IP of the first-stage shift register SR(1) is configured to be coupled with a frame trigger signal end STV.

In every two adjacent shift registers, an input signal end IP of the next stage of shift register SR(n) is configured to be coupled with a cascade signal output end GP of the previous stage of shift register SR(n−1).

The structure of each shift register in the above driving control circuit is the same as the above shift register in the present disclosure in function and structure, and the repetitions are omitted. The driving control circuit may be configured in a liquid crystal display panel or an electroluminescent display panel, which is not limited here.

For example, in the above driving control circuit provided by the embodiments of the present disclosure, first reference signal ends VREF1 of all stage of shift registers are coupled with the same first direct current signal end, and second reference signal ends VREF2 of all stage of shift registers are coupled with the same second direct current signal end.

For example, in the driving control circuit provided by the embodiments of the present disclosure, first control clock signal ends CK of odd-numbered stages of shift registers and second control clock signal ends CKB of even-numbered stages of shift registers are coupled with the same clock end, namely a first control clock end. Second control clock signal ends CKB of the odd-numbered stages of shift registers and first control clock signal ends CK of the even-numbered stages of shift registers are coupled with the same clock end, namely a second control clock end.

For example, in the above driving control circuit provided by the embodiments of the present disclosure, first noise reduction clock signal ends CKO of the odd-numbered stages of shift registers and second noise reduction clock signal ends CKBO of the even-numbered stages of shift registers are coupled with the same clock end, namely a first noise reduction clock end. Second noise reduction clock signal ends CKBO of the odd-numbered stages of shift registers and first noise reduction clock signal ends CKO of the even-numbered stages of shift registers are coupled with the same clock end, namely a second noise reduction clock end.

Based on the same inventive concept, embodiments of the present disclosure further provide a display device, including the above gate driving control circuit provided by the embodiments of the present disclosure. Principles of the display device for solving the problems are similar to that of the above shift register, therefore, implementation of the display device may refer to that of the above shift register, and repetitions are omitted.

During implementations, the above display device provided by the embodiments of the present disclosure may be: any product or part with a display function, such as a mobile phone, a tablet personal computer, a television, a display, a notebook computer, a digital photo frame, a navigator and the like. It should be understood by a person of ordinary skill in the art that the display device should have other essential constituent parts, which is not repeated here and may also not be regarded as limitation to the present disclosure.

During implementations, the display device may include a plurality of pixel units, a plurality of grid lines, and data lines, and each pixel unit may include a plurality of sub-pixels, such as a red sub-pixel, a green sub-pixel, and a blue sub-pixel. The above display device provided by the embodiments of the present disclosure may be an organic light-emitting display device or a liquid crystal display device, which is not limited here.

Figure 9:
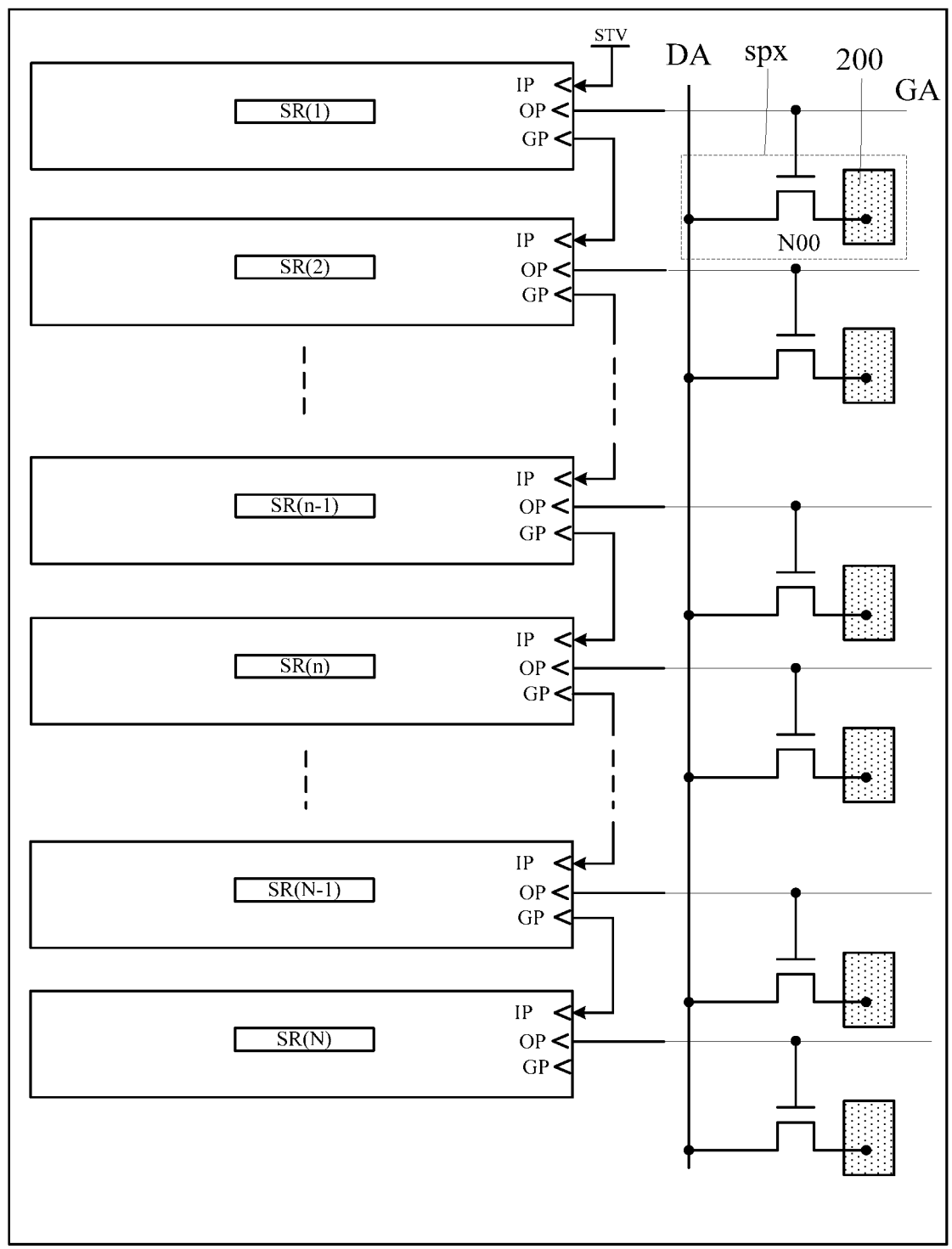
FIG. 9 is a schematic structural diagram of some display devices provided by an embodiment of the present disclosure.

In the liquid crystal display device, as shown in FIG. 9, one row of sub-pixels spx are coupled with one grid line GA, and one column of sub-pixels spx are coupled with one data line DA. Each sub-pixel spx may include a scanning transistor N00 and a pixel electrode 200. A grid electrode of the scanning transistor N00 may be coupled with the grid line GA, a source electrode of the scanning transistor N00 is coupled with the data line DA, and a drain electrode of the scanning transistor N00 is coupled with the pixel electrode 200. Moreover, a driving signal end OP of one shift register is coupled with one grid line GA. In this way, the driving signal end OP of the shift register may be made to provide a signal to the grid electrode of the scanning transistor N00 in each sub-pixel, and a cascade signal end GP of the shift register is configured to transmit a starting signal for the next stage of shift register. In this way, when the above display device provided by the embodiments of the present disclosure is the liquid crystal display device, the above driving control circuit may serve as a gate driving control circuit and is applied to providing a gate scanning signal of the scanning transistor N00. It should be noted that the scanning transistor N00 may be an N-type transistor or a P-type transistor, which is not limited here.

Figure 10:
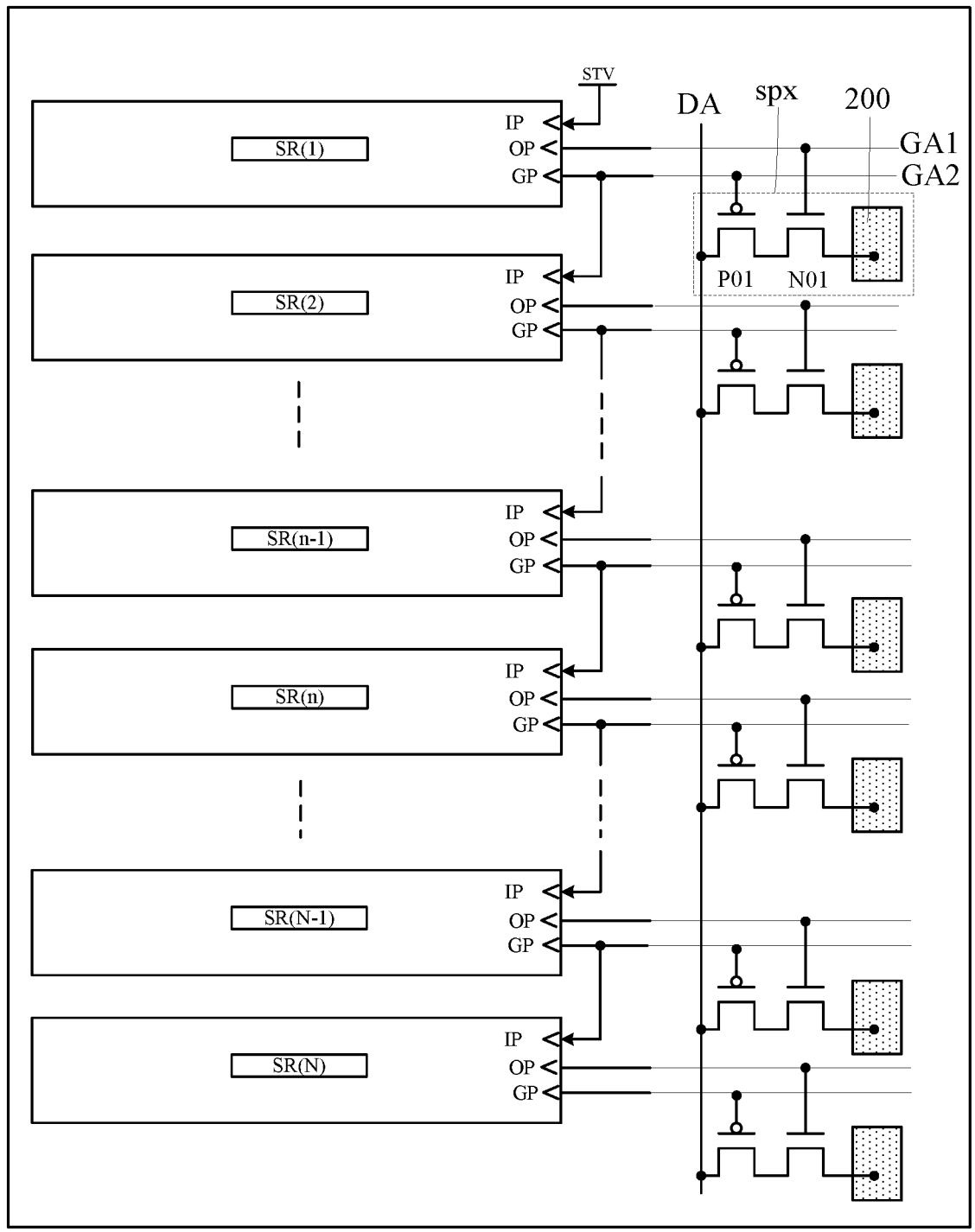
FIG. 10 is a schematic structural diagram of some other display devices provided by an embodiment of the present disclosure.

Further, two different types of transistors may also be arranged in the sub-pixels. As shown in FIG. 10, the display device may include a plurality of first gate lines GA1 and a plurality of second gate lines GA2. One row of sub-pixels are coupled with one first grid line GA1 and one second grid line GA2. Each sub-pixel spx may include a first scanning transistor N01, a second scanning transistor P01, and a pixel electrode 200. The first scanning transistor N01 is an N-type transistor, and the second scanning transistor P01 is a P-type transistor. A grid electrode of the first scanning transistor N01 is coupled with the first grid line GA1, and the second scanning transistor P01 is coupled with the second grid line GA2. A source electrode of the second scanning transistor P01 is coupled with the data line DA, a drain electrode of the second scanning transistor P01 is coupled with a source electrode of the first scanning transistor N01, and a drain electrode of the first scanning transistor N01 is coupled with the pixel electrode 200. Moreover, the driving signal end OP of one shift register is coupled with one first grid line GA1, and the cascade signal end GP of one shift register is coupled with one second grid line GA2. In this way, the driving signal end OP of the shift register may be made to provide signals to the grid electrodes of the N-type transistors in the sub-pixels. And the cascade signal end GP of the shift register is made to provide signals to the grid electrodes of the P-type transistors in the sub-pixels, and the cascade signal end GP is further configured to transmit a starting signal for the next stage of shift register. In this way, when the display device provided by the embodiments of the present disclosure is the liquid crystal display device, the above driving control circuit may serve as a gate driving control circuit and is applied to providing a gate scanning signal.

In an organic light-emitting display device, a plurality of organic light-emitting diodes and pixel circuits connected with the organic light-emitting diodes are generally arranged. A general pixel circuit is provided with a light-emitting control transistor configured to control the organic light-emitting diodes to emit light and a scanning control transistor configured to control data signal input. During implementations, when the above display device provided by the embodiments of the present disclosure is the organic light-emitting display device, the organic light-emitting display device may include one above driving control circuit provided by the embodiments of the present disclosure, and the driving control circuit may serve as a light-emitting driving control circuit and is applied to providing a light-emitting control signal of the light-emitting control transistor; or the light-emitting control circuit may also serve as the gate driving control circuit and is applied to providing the gate scanning signal of the scanning control transistor. The organic light-emitting display device may also include the two above driving control circuits provided by the embodiments of the present disclosure, and one driving control circuit can serve as the light-emitting driving control circuit and is applied to providing the light-emitting control signal of the light-emitting control transistor; and the other driving control circuit serves as the gate driving control circuit and is applied to providing the gate scanning signal of the scanning control transistor, which is not limited here.

Although the preferred embodiments of the present disclosure have been described, those skilled in the art can make additional modifications and variations to the embodiments once they know the basic creative concept. Therefore, the appended claim intends to be explained as including the preferred embodiments and all modifications and variations falling within the scope of the present disclosure.

Obviously, those skilled in the art can make various modifications and variations to the present disclosure without departing from the spirit and scope of the present disclosure. In this way, if these modifications and variations of the present disclosure fall within the scope of the claims of the present disclosure and their equivalent art, the present disclosure also intends to include these modifications and variations.

What is claimed is:

1. A driving method of a shift register, comprising: at a first refresh frequency, one display frame comprising a data refresh stage and a data retention stage, wherein the data retention stage comprises a denoising retention stage and a denoising enhancement stage alternately arranged;
   at the data refresh stage, loading an input signal with a pulse level to an input signal end, loading a control clock pulse signal to a control clock signal end, loading a noise reduction clock pulse signal to a noise reduction clock signal end, loading a fixed voltage signal to a first reference signal end, loading a fixed voltage signal to a second reference signal end, and controlling a cascade signal end of the shift register to output a cascade signal with a pulse level, and control a driving signal end of the shift register to output a driving signal with a pulse level;
   at the denoising retention stage, loading a fixed voltage signal to the input signal end, loading a fixed voltage signal to the control clock signal end, loading a fixed voltage signal to the noise reduction clock signal end, loading a fixed voltage signal to the first reference signal end, loading a fixed voltage signal to the second reference signal end, and controlling the cascade signal end to output a fixed voltage signal, and controling the driving signal end to output a fixed voltage signal; and
   at the denoising enhancement stage, loading a fixed voltage signal to the input signal end, loading a fixed voltage signal to the control clock signal end, loading a clock pulse signal to the noise reduction clock signal end, loading a fixed voltage signal to the first reference signal end, loading a fixed voltage signal to the second reference signal end, and controlling the cascade signal end to output a fixed voltage signal, and controlling the driving signal end to output a fixed voltage signal.

2. The driving method according to claim 1, wherein the noise reduction clock signal end comprises a first noise reduction clock signal end and a second noise reduction clock signal end; and the noise reduction clock pulse signal comprises a first noise reduction clock pulse signal and a second noise reduction clock pulse signal, wherein cycles of the first noise reduction clock pulse signal and the second noise reduction clock pulse signal are same, and a phase difference between the first noise reduction clock pulse signal and the second noise reduction clock pulse signal is ½ of the cycle;
   at the data refresh stage, said loading the noise reduction clock pulse signal to the noise reduction clock signal end comprises:
      loading the first noise reduction clock pulse signal to the first noise reduction clock signal end, and loading the second noise reduction clock pulse signal to the second noise reduction clock signal end;
   at the denoising retention stage, said loading the fixed voltage signal to the noise reduction clock signal end comprises:
      loading a fixed voltage signal with a first level to the first noise reduction clock signal end, and loading a fixed voltage signal with the first level to the second noise reduction clock signal end; and
   at the denoising enhancement stage, said loading the clock pulse signal to the noise reduction clock signal end comprises:
      loading the first noise reduction clock pulse signal to the first noise reduction clock signal end, and loading the second noise reduction clock pulse signal to the second noise reduction clock signal end,
      wherein the first level of the first noise reduction clock pulse signal in the denoising enhancement stage is adjacent to the denoising retention stage appearing before the denoising enhancement stage, and a second level of the second noise reduction clock pulse signal in the denoising enhancement stage is adjacent to the denoising retention stage appearing before the denoising enhancement stage.

3. The driving method according to claim 2, wherein in the denoising enhancement stage, a quantity of clock cycles of the first noise reduction clock pulse signal and a quantity of clock cycles of the second noise reduction clock pulse signal are same, and the quantity of the clock cycles is at least one.

4. The driving method according to claim 3, wherein in one same denoising enhancement stage, a falling edge of the first noise reduction clock pulse signal and a falling edge of the second noise reduction clock pulse signal are respectively aligned with a starting moment of a denoising retention stage appearing after the denoising enhancement stage, and a rising edge of the second noise reduction clock pulse signal is aligned with an end moment of the denoising retention stage appearing before the denoising enhancement stage; and
   in the data refresh stage and the denoising enhancement stage, maintaining durations of the second level of the second noise reduction clock pulse signal are same.

5. The driving method according to claim 3, wherein in the denoising enhancement stage, the quantity of the clock cycles of the first noise reduction clock pulse signal is an even number;
   in one same denoising enhancement stage, a falling edge of the first noise reduction clock pulse signal is aligned with a starting moment of a denoising retention stage appearing after the denoising enhancement stage, and in the first noise reduction clock pulse signal, a signal between a rising edge close to the denoising retention stage appearing before the denoising enhancement stage and the denoising retention stage appearing before the denoising enhancement stage is the first level; and
   in the same denoising enhancement stage, a rising edge of the second noise reduction clock pulse signal is aligned with an end moment of the denoising retention stage appearing before the denoising enhancement stage, and in the second noise reduction clock pulse signal, a signal between a falling edge close to the denoising retention stage appearing after the denoising enhancement stage and the denoising retention stage appearing after the denoising enhancement stage is the first level.

6. The driving method according to claim 1, wherein the control clock signal end comprises a first control clock signal end and a second control clock signal end, and the control clock pulse signal comprises a first control clock pulse signal and a second control clock pulse signal, wherein cycles of the first control clock pulse signal and the second control clock pulse signal are same, and a phase difference between the first control clock pulse signal and the second control clock pulse signal is ½ cycle;
- the pulse levels of the input signal and the cascade signal are first levels;
- the pulse level of the driving signal is a second level;
- the fixed voltage signal of the first reference signal end is the first level;
- the fixed voltage signal of the second reference signal end is the second level;
- said loading the control clock pulse signal to the control clock signal end comprises: loading the first control clock pulse signal to the first control clock signal end, and loading the second control clock pulse signal to the second control clock signal end;
- said loading the fixed voltage signal to the control clock signal end comprises: loading a fixed voltage signal with the second level to the first control clock signal end, and loading a fixed voltage signal with the second level to the second control clock signal end;
- said loading the fixed voltage signal to the input signal end comprises: loading a fixed voltage signal with the second level to the input signal end; and
- said controlling the cascade signal end to output the fixed voltage signal and said controlling the driving signal end to output the fixed voltage signal comprise: controlling the cascade signal end to output a fixed voltage signal with the second level, and controlling the driving signal end to output a fixed voltage signal with the first level.

7. The driving method according to claim 1, further comprising: at a second refresh frequency, one display frame comprising a data refresh stage; and
- at the data refresh stage, loading an input signal with a pulse level to the input signal end, loading a control clock pulse signal to the control clock signal end, loading a noise reduction clock pulse signal to the noise reduction clock signal end, loading a fixed voltage signal to the first reference signal end, loading a fixed voltage signal to the second reference signal end, controlling the cascade signal end of the shift register to output a cascade signal with a pulse level, and controlling the driving signal end of the shift register to output a driving signal with a pulse level.

8. A shift register, comprising:
- an input control circuit, respectively coupled with an input signal end, a first control clock signal end, a second control clock signal end, a first reference signal end, a second reference signal end, a pull-down node and a first pull-up node, wherein the input control circuit is configured to provide a signal of the input signal end to the first pull-up node in response to a signal of the first control clock signal end, provide a signal of the second reference signal end to a signal of the first pull-up node in response to a signal of the pull-down node and a signal of the second control clock signal end, and control the signal of the pull-down node according to the signal of the first pull-up node, the signal of the first control clock signal end and a signal of the first reference signal end;
- a first transistor, wherein a grid electrode of the first transistor is configured to be coupled with the first reference signal end, a first electrode of the first transistor is configured to be coupled with the first pull-up node, and a second electrode of the first transistor is configured to be coupled with a second pull-up node;
- a cascade output circuit, respectively coupled with the pull-down node, the second pull-up node, the second reference signal end, the second control clock signal end and a cascade signal end, wherein the cascade output circuit is configured to provide the signal of the second control clock signal end to the cascade signal end under control of a signal of the second pull-up node, and provide the signal of the second reference signal end to the cascade signal end under control of the signal of the pull-down node; and
- a driving output circuit, respectively coupled with the cascade signal end, a first noise reduction clock signal end, a second noise reduction clock signal end, the first reference signal end, the second reference signal end and a driving signal end, wherein the driving output circuit is configured to provide the signal of the second reference signal end to the driving signal end in response to a signal of the cascade signal end, and provide the signal of the first reference signal end to the driving signal end in response to signals of the first noise reduction clock signal end and the second noise reduction clock signal end.

9. The shift register according to claim 8, wherein the driving output circuit comprises: a second transistor, a third transistor, a fourth transistor, a fifth transistor, a first capacitor and a second capacitor;
- a grid electrode of the second transistor is coupled with the cascade signal end, a first electrode of the second transistor is coupled with the second reference signal end, and a second electrode of the second transistor is coupled with a grid electrode of the fifth transistor;
- a grid electrode of the third transistor is coupled with the first noise reduction clock signal end, a first electrode of the third transistor is coupled with the first reference signal end, and a second electrode of the third transistor is coupled with the grid electrode of the fifth transistor;
- a grid electrode of the fourth transistor is coupled with the cascade signal end, a first electrode of the fourth transistor is coupled with the second reference signal end, and a second electrode of the fourth transistor is coupled with the driving signal end;
- a first electrode of the fifth transistor is coupled with the first reference signal end, and a second electrode of the fifth transistor is coupled with the driving signal end;
- a first electrode of the first capacitor is coupled with the second noise reduction clock signal end, and a second electrode of the first capacitor is coupled with the grid electrode of the fifth transistor; and
- a first electrode of the second capacitor is coupled with the grid electrode of the fifth transistor, and the second electrode of the first capacitor is coupled with the driving signal end.

10. The shift register according to claim 9, wherein the cascade output circuit comprises a sixth transistor, a seventh transistor, a third capacitor and a fourth capacitor;
- a grid electrode of the sixth transistor is coupled with the second pull-up node, a first electrode of the sixth transistor is coupled with the second control clock signal end, and a second electrode of the sixth transistor is coupled with the cascade signal end;

a grid electrode of the seventh transistor is coupled with the pull-down node, a first electrode of the seventh transistor is coupled with the second reference signal end, and a second electrode of the seventh transistor is coupled with the cascade signal end;

a first electrode of the third capacitor is coupled with the second pull-up node, and a second electrode of the third capacitor is coupled with the cascade signal end; and a first electrode of the fourth capacitor is coupled with the pull-down node, and a second electrode of the fourth capacitor is coupled with the second reference signal end.

11. The shift register according to claim 8, wherein the input control circuit comprises an eighth transistor, a ninth transistor, a tenth transistor, an eleventh transistor and a twelfth transistor;

a grid electrode of the eighth transistor is coupled with the first control clock signal end, a first electrode of the eighth transistor is coupled with the input signal end, and a second electrode of the eighth transistor is coupled with the first pull-up node;

a grid electrode of the ninth transistor is coupled with the first control clock signal end, a first electrode of the ninth transistor is coupled with the first reference signal end, and a second electrode of the ninth transistor is coupled with the pull-down node;

a grid electrode of the tenth transistor is coupled with the first pull-up node, a first electrode of the tenth transistor is coupled with the first control clock signal end, and a second electrode of the tenth transistor is coupled with the pull-down node;

a grid electrode of the eleventh transistor is coupled with the pull-down node, a first electrode of the eleventh transistor is coupled with the second reference signal end, and a second electrode of the eleventh transistor is coupled with a first electrode of the twelfth transistor; and a grid electrode of the twelfth transistor is coupled with the second control clock signal end, and a second electrode of the twelfth transistor is coupled with the first pull-up node.

12. The shift register according to claim 8, wherein the driving output circuit comprises: a second transistor, a third transistor, a fourth transistor, and a fifth transistor; the cascade output circuit comprises a sixth transistor and a seventh transistor; and the input control circuit comprises an eighth transistor, a ninth transistor, a tenth transistor, an eleventh transistor and a twelfth transistor;

wherein a grid electrode of the second transistor is coupled with the cascade signal end, a first electrode of the second transistor is coupled with the second reference signal end, and a second electrode of the second transistor is coupled with a grid electrode of the fifth transistor;

a grid electrode of the third transistor is coupled with the first noise reduction clock signal end, a first electrode of the third transistor is coupled with the first reference signal end, and a second electrode of the third transistor is coupled with the grid electrode of the fifth transistor;

a grid electrode of the fourth transistor is coupled with the cascade signal end, a first electrode of the fourth transistor is coupled with the second reference signal end, and a second electrode of the fourth transistor is coupled with the driving signal end;

a first electrode of the fifth transistor is coupled with the first reference signal end, and a second electrode of the fifth transistor is coupled with the driving signal end;

a grid electrode of the sixth transistor is coupled with the second pull-up node, a first electrode of the sixth transistor is coupled with the second control clock signal end, and a second electrode of the sixth transistor is coupled with the cascade signal end;

a grid electrode of the seventh transistor is coupled with the pull-down node, a first electrode of the seventh transistor is coupled with the second reference signal end, and a second electrode of the seventh transistor is coupled with the cascade signal end;

a grid electrode of the eighth transistor is coupled with the first control clock signal end, a first electrode of the eighth transistor is coupled with the input signal end, and a second electrode of the eighth transistor is coupled with the first pull-up node;

a grid electrode of the ninth transistor is coupled with the first control clock signal end, a first electrode of the ninth transistor is coupled with the first reference signal end, and a second electrode of the ninth transistor is coupled with the pull-down node;

a grid electrode of the tenth transistor is coupled with the first pull-up node, a first electrode of the tenth transistor is coupled with the first control clock signal end, and a second electrode of the tenth transistor is coupled with the pull-down node;

a grid electrode of the eleventh transistor is coupled with the pull-down node, a first electrode of the eleventh transistor is coupled with the second reference signal end, and a second electrode of the eleventh transistor is coupled with a first electrode of the twelfth transistor; and a grid electrode of the twelfth transistor is coupled with the second control clock signal end, and a second electrode of the twelfth transistor is coupled with the first pull-up node;

wherein a width-to-length ratio of a channel region of an active layer of at least one of the fourth transistor, the fifth transistor, the sixth transistor or the seventh transistor is greater than a width-to-length ratio of a channel region of an active layer of at least one of the first transistor, the second transistor, the third transistor, the eighth transistor, the ninth transistor, the tenth transistor, the eleventh transistor or the twelfth transistor.

13. The shift register according claim 12, wherein the width-to-length ratio of the channel region of the active layer of at least one of the fourth transistor, the fifth transistor, the sixth transistor or the seventh transistor ranges from 10 µm/2 µm to 100 µm/10 µm; and the width-to-length ratio of the channel region of the active layer of at least one of the first transistor, the second transistor, the third transistor, the eighth transistor, the ninth transistor, the tenth transistor, the eleventh transistor or the twelfth transistor ranges from 2 µm/2 µm to 20 µm/10 µm.

14. The shift register according to claim 9, wherein the cascade output circuit comprises a third capacitor and a fourth capacitor; a first electrode of the third capacitor is coupled with the second pull-up node, and a second electrode of the third capacitor is coupled with the cascade signal end; and a first electrode of the fourth capacitor is coupled with the pull-down node, and a second electrode of the fourth capacitor is coupled with the second reference signal end;

wherein a capacitance value of at least one of the first capacitor, the second capacitor, the third capacitor or the fourth capacitor ranges from 10 fF to 1 pF.

15. A driving control circuit, comprising a plurality of cascaded shift registers according to claim 8; wherein
   an input signal end of a first-stage shift register is coupled with a frame trigger signal end; and
   in every two adjacent stages of shift registers, an input signal end of a next stage of shift register is coupled with a cascade signal end of a previous stage of shift register.

16. A display device, comprising the driving control circuit according to claim 15.

* * * * *